(12) United States Patent
Chen et al.

(10) Patent No.: US 12,219,746 B2
(45) Date of Patent: Feb. 4, 2025

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Chun-Hung Chen, Hsinchu (TW); Jhon-Jhy Liaw, Zhudong Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 435 days.

(21) Appl. No.: 17/826,225

(22) Filed: May 27, 2022

(65) Prior Publication Data

US 2023/0389252 A1 Nov. 30, 2023

(51) Int. Cl.
*H10B 10/00* (2023.01)

(52) U.S. Cl.
CPC .................................. *H10B 10/12* (2023.02)

(58) Field of Classification Search
CPC ............... H01L 29/785; H01L 21/0228; H01L 21/3083; H01L 21/823821; H01L 27/0924; H01L 29/0649; H01L 29/4232; H01L 29/66545; H01L 29/6681; H01L 29/0688

See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 2014/0197457 | A1* | 7/2014 | Wang ................ H01L 29/66818 257/192 |
| 2020/0105612 | A1* | 4/2020 | Lin ................... H01L 29/66545 |

* cited by examiner

*Primary Examiner* — Karen Kusumakar
*Assistant Examiner* — Adam S Bowen
(74) *Attorney, Agent, or Firm* — McClure, Qualey & Rodack, LLP

(57) ABSTRACT

A method for forming a semiconductor structure is provided. The method for forming the semiconductor structure includes forming a first trench and a second trench in a first semiconductor material. The first trench is deeper than the second trench. The method also includes forming a second semiconductor material in the first trench and the second trench, patterning a first portion of the second semiconductor material in the first trench and a first portion of the first semiconductor material below the first portion of the second semiconductor material into a first fin structure, and patterning a second portion of the second semiconductor material in the second trench and a second portion of the first semiconductor material below the second portion of the second semiconductor material into a second fin structure, and forming an isolation structure surrounding the first fin structure and the second fin structure.

20 Claims, 27 Drawing Sheets

SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 2F, 2G, 2H-1, 2H-2, 2I-1, 2I-2, 2I-1, 2I-2, 2K-1, 2K-2, 2L-1, and 2L-2 are cross-sectional views illustrating the formation of a semiconductor structure at various intermediate stages, in accordance with some embodiments of the disclosure.

DETAILED DESCRIPTION

Figure 1:
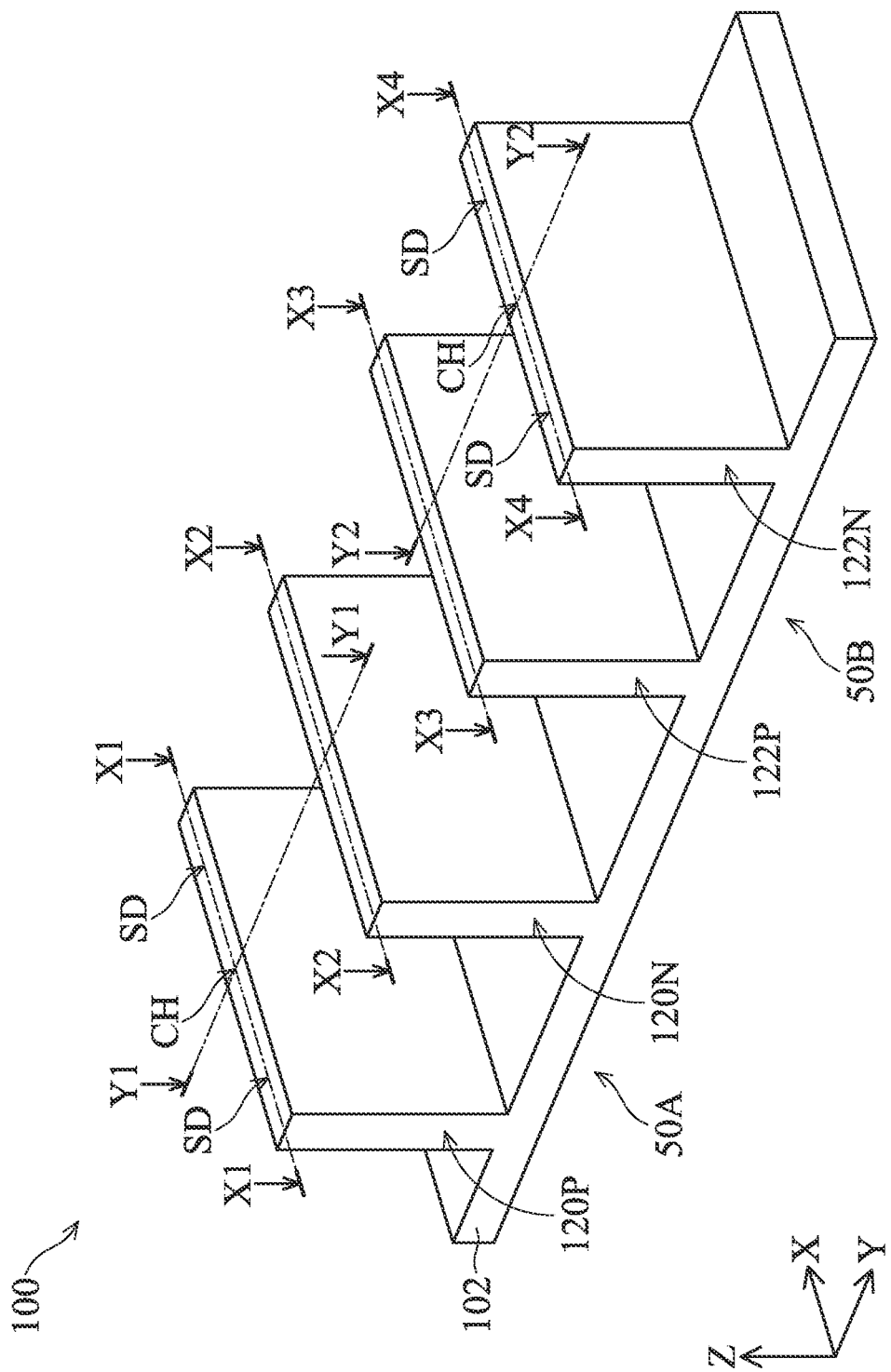
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of forming a semiconductor structure are provided. The aspect of the present disclosure is directed to forming p-channel devices in a logic area and a memory cell array area having respective enhancing performances. The logic devices may focus more on high on-current, while memory devices (e.g., SRAM) may focus more on improvement in short channel effect (SCE). In accordance with some embodiments, a top fin element of a first fin structure for logic devices is formed with a greater thickness than a top fin element of a second fin structure for memory devices. Therefore, the top fin element of the first fin structure may provide a relatively large area of the channel, which enhance the performance of the resulting logic device. Furthermore, the final gate stack can have better control over the top fin element of the second fin structure, which may enhance the performance of the resulting SRAM device. Therefore, the embodiments of the present disclosure may provide great flexibility in turning the respective performances of the logic p-channel device and SRAM p-channel device.

FIG. 1 is a perspective view of a semiconductor structure 100, in accordance with some embodiments of the disclosure. The semiconductor structure 100 includes a substrate 102, in accordance with some embodiments. The semiconductor structure 100 (or the substrate 102) may include various device areas, e.g., a logic area, a memory cell array area, an analog region, a peripheral area (e.g., an input/output area), another suitable area, or a combination thereof. FIG. 1 illustrates a logic area 50A and a memory cell array area 50B of the semiconductor structure 100 (or the substrate 102), in accordance with some embodiments. The logic area 50A and the memory cell array area 50B are part of an integrated circuit (IC) device, in accordance with some embodiments.

Logic devices are to be formed in the logic area 50A, and the memory devices (e.g., SRAM (Static Random-Access Memory), DRAM (Dynamic Random Access Memory), or Flash memory) are to be formed in the memory cell array area 50B, in accordance with some embodiments. The logic devices perform the designed functions of an integrated circuit (IC) device, and the memory devices are operable as data storage, in accordance with some embodiments. The logic devices may be operable to access and/or control (e.g., perform read/write/erase operation) the memory devices, in accordance with some embodiments. Although the logic area 50A and the memory cell array area 50B are shown as being immediately adjacent to one another in FIG. 1, the logic area 50A and the memory cell array area 50B may be spaced apart from one another by another device area, in accordance with some embodiments.

For a better understanding of the semiconductor structure, an X-Y-Z coordinate reference is provided in FIG. 1. The X-axis and Y-axis are generally orientated along the lateral (or horizontal) directions that are parallel to the main surface of the semiconductor structure. The Y-axis is transverse (e.g., perpendicular or substantially perpendicular) to the X-axis. The Z-axis is generally oriented along the vertical direction that is perpendicular to the main surface of a semiconductor structure (or the X-Y plane).

The semiconductor structure 100 includes fin structures 120P and 120N over the logic area 50A of the substrate 102, and fin structures 122P and 122N over the memory cell array area 50B of the substrate 102, as shown in FIG. 1, in accordance with some embodiments. The fin structure 120P and the fin structure 120N are used to form p-channel FinFETs and n-channel FinFETs for logic devices, respectively, in accordance with some embodiments. The fin structure 122P and the fin structure 122N are used to form p-channel FinFETs and n-channel FinFETs for memory devices, respectively, in accordance with some embodiments.

The fin structures 120P, 120N, 122P and 122N extend in the X direction, in accordance with some embodiments. That is, the fin structures 120P, 120N, 122P and 122N have longitudinal axes parallel to the X direction, in accordance with some embodiments. The X direction may also be referred to as the channel-extending direction. The current of the resulting semiconductor devices (i.e., FinFETs) flows in the X direction through the channel.

Each of the fin structures 120P, 120N, 122P and 122N includes a channel region CH and source/drain regions SD, where the channel region CH is defined between the source/drain regions SD, in accordance with some embodiments, in this disclosure, a source/drain refers to a source and/or a drain. It should be noted that in the present disclosure, a source and a drain are used interchangeably and the structures thereof are substantially the same. FIG. 1 shows one channel region CH and two source/drain regions SD for illustrative purposes and is not intended to be limiting. The number of channel regions CH and source/drain regions SD may be dependent on the demands on the design of the semiconductor device and/or performance considerations.

A gate structure or gate stack (not shown) will be formed with a longitudinal axis parallel to the Y direction and extending across and/or surrounding the channel regions CH of the fin structures 120P, 120N, 122P and 122N. The Y direction may also be referred to as a gate-extending direction.

FIG. 1 further illustrates reference cross-sections that are used in later figures. Cross-section Y1-Y1 is in a plane parallel to the longitudinal axis (Y direction) of a gate structure and across the channel regions CH of the fin structures 120P and 120N, in accordance with some embodiments. Cross-section Y2-Y2 is in a plane parallel to the longitudinal axis (Y direction) of a gate structure and across channel regions CFI of the fin structure 122P and 122N, in accordance with some embodiments.

Cross-sections X1-X1, X2-X2, X3-X3 and X4-X4 are in planes parallel to the longitudinal axis (X direction) of the fin structures 120P, 120N, 122P and 122N and through the fin structures 120P, 120N, 122P and 122N respectively, in accordance with some embodiments.

FIGS. 2A, 2B, 2C, 2D, 2E, 2F, 2G, 2H-1, 2H-2, 2I-1, 2I-2, 2J-1, 2J-2, 2K-1, 2K-2, 2L-1, and 2L-2 are cross-sectional views illustrating the formation of a semiconductor structure at various intermediate stages, in accordance with some embodiments of the disclosure. FIGS. 2A, 213, 2C, 2D, 2E, 2F, 2G, 2H-1, 2I-1, 2I-1, 2K-I and 2L-1 correspond to the cross-sections Y1-Y1 and Y2-Y2 of FIG. I. FIGS. 2H-2, 2I-2, 2J-2, 2K-2, and 2L-2 correspond to the cross-sections X1-X1, X2-X2, X3-X3 and X4-X4 of FIG. 1.

Figure 2A:
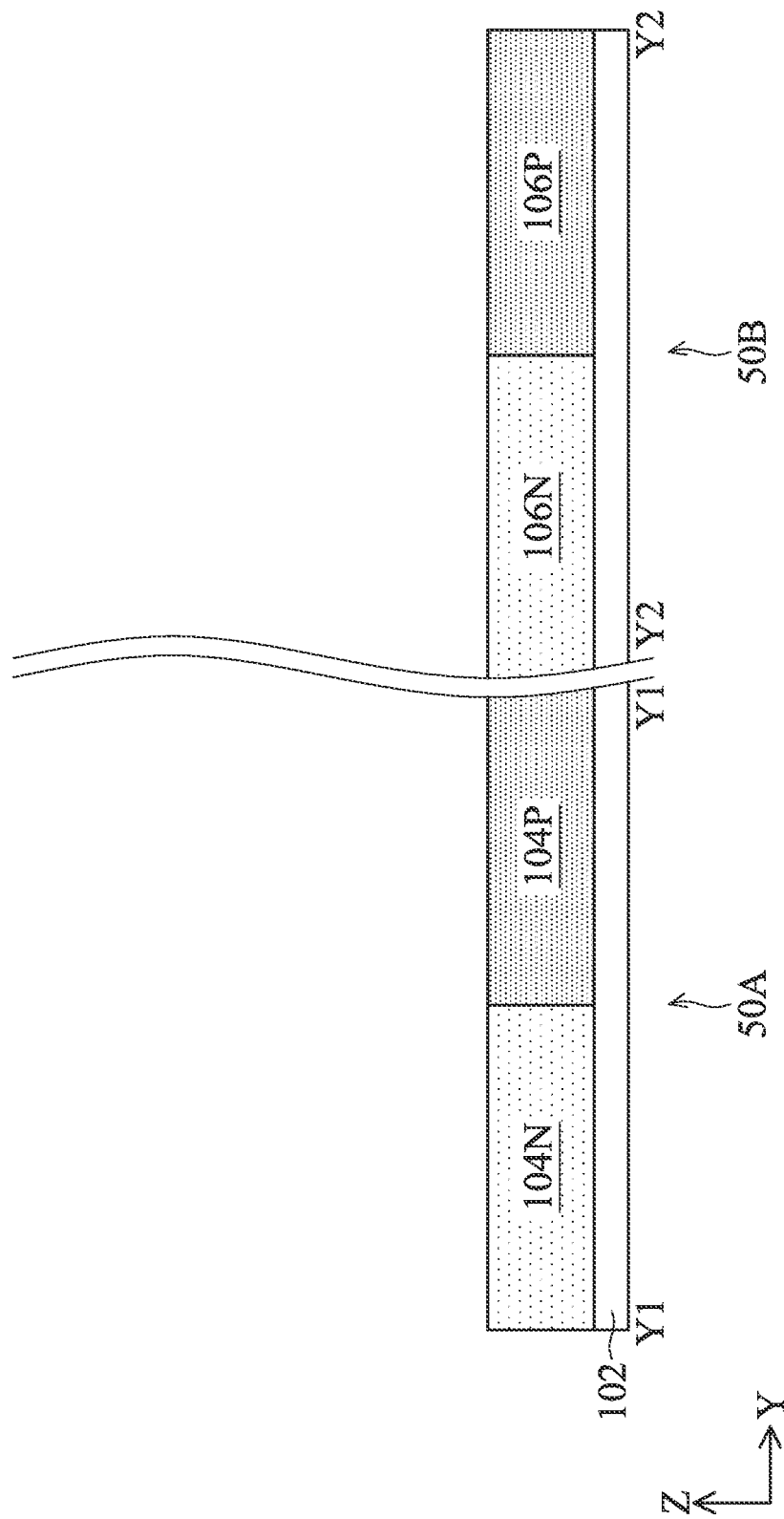

FIG. 2A illustrates a semiconductor structure after the formation of wells 104N, 104P, 106N and 106P, in accordance with some embodiments.

A substrate 102 is provided, as shown in FIG. 2A, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonids (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

Some areas of the substrate 102 are defined as a logic area 50A for forming logic devices thereon and a memory cell array area 50B for forming memory devices (e.g., SRAM) thereon, as shown in FIG. 2A, in accordance with some embodiments.

An n-type well 104N and a p-type well 104P are formed in the logic area 50A of the substrate 102, and an n-type well 106N and a p-type well 106P are formed in the memory cell array area 50B of the substrate 102, as shown in FIG. 2A, in accordance with some embodiments. In some embodiments, the wells 104N, 104P, 106N and 106P are formed by ion implantation processes.

For example, a patterned mask layer (such as a photoresist layer and/or a hard mask layer) is formed to cover regions of the substrate 102 where the p-type wells are predetermined to be formed, and then n-type dopants (such as phosphorus or arsenic) are implanted into the substrate 102, thereby forming the n-type wells 104N and 106N, in accordance with some embodiments. Afterward, the patterned mask layer may be removed.

Similarly, a patterned mask layer (such as photoresist layer and/or hard mask layer) is formed to cover regions of the substrate 102 where the n-type wells are predetermined to be formed, and then p-type dopants (such as boron or $BF_2$) are implanted into the substrate 102, thereby forming the p-type wells 104P and 106P, in accordance with some embodiments, Afterward, the patterned mask layer may be removed.

In some embodiments, the respective concentrations of the dopants in the wells 104N, 104P, 106N and 106P are in a range from about $10^{16}/cm^{-3}$ to about $10^{18}/cm^{-3}$. In sonic embodiments, the ion implantation processes may be performed several times with different dosages and different energy intensities. In some embodiments, the ion implantation process may include anti-punch through (APT) implant.

The numbers of the n-type wells 104N and the p-type wells 104N in the logic area 50A and/or the numbers of the n-type wells 106N and the p-type wells 106N in the memory cell array area 50B may be dependent on the demands on the design of the semiconductor device and/or performance considerations. In some embodiments, in the logic area 50A, the n-type wells 104N and the p-type wells 104N are alternately arranged in the Y direction. In some embodiments, in the memory cell array area 50B, the n-type wells 106N and the p-type wells 106N are alternately arranged in the Y direction.

In some embodiments, the width (in the Y direction) of the n-type well 104N is substantially the same as the width (in the Y direction) of the n-type well 106N, while the width (in the Y direction) of the p-type well 104P is substantially same as the width (in the Y direction) of the p-type well 106P. In some embodiments, the pitch (in the Y direction) of the n-type well 104N (or the p-type well 104P) is substantially the same as the pitch (in the Y direction) of the n-type well 106N (or the p-type well 106P).

Figure 2B:
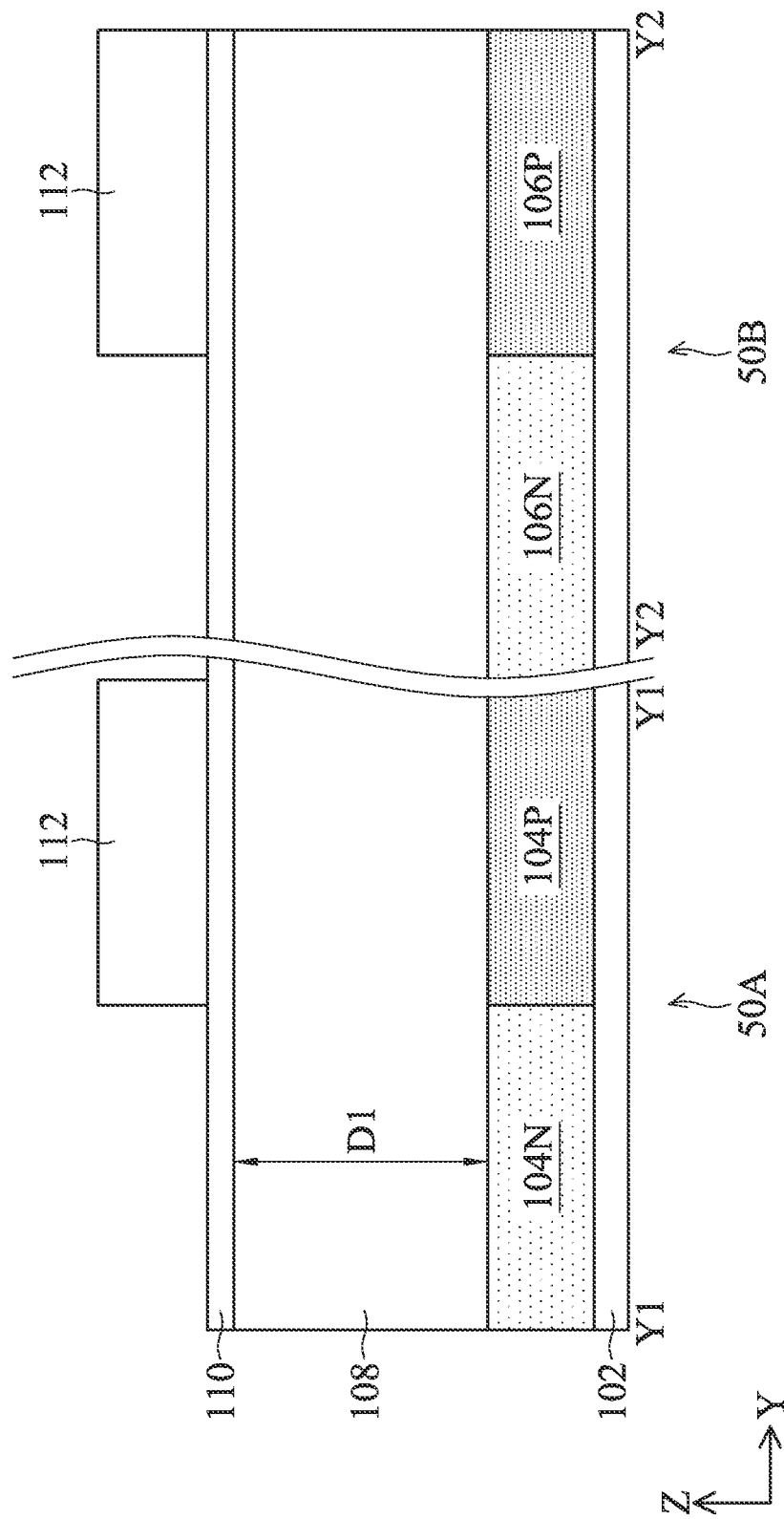

FIG. 2B illustrates a semiconductor structure after the formation of a semiconductor material 108, a dielectric layer 110 and a patterned mask layer 112, in accordance with sonic embodiments.

A semiconductor material 108 is formed over the substrate 102, as shown in FIG. 28, in accordance with some embodiments. In some embodiments, the semiconductor material 108 is pure or substantially pure silicon. The concentrations of the impurity (or the dopant) in the semiconductor material 108 is less than the concentrations of the dopants in the wells 104N, 104P, 106N and 106P, in accordance with some embodiments. For example, the concentrations of the impurity (or the dopant) in the semiconductor material 108 is less than $10^{14}/cm^{-3}$.

In some embodiments, the semiconductor material 108 is globally grown over the substrate 102 using an epitaxial growth process. The epitaxial growth process may be molecular beam epitaxy (MBE), metal organic chemical vapor deposition (MOCVD), or vapor phase epitaxy (VPE), or another suitable technique. In some embodiments, the semiconductor material 108 has a thickness D1 (in the Z direction) in a range from about 27.5 nm to about 200 nm.

A dielectric layer 110 is formed over the semiconductor material 108, as shown in FIG. 2B, in accordance with some embodiments. In some embodiments, the dielectric layer 110 is made of dielectric material, such as silicon oxide ($SiO_2$), silicon oxynitride (SiON), silicon nitride (SiN), silicon carbon nitride (SiCN), silicon oxycarbonitride (SiOCN), oxygen-doped silicon carbonitride (Si(O)CN), another suitable dielectric material.

In some embodiments, the dielectric layer 110 is globally deposited over the semiconductor material 108. The deposition process may be chemical vapor deposition (CVD) (such as low-pressure CVD (LPCVD), plasma-enhanced CVD (PECVD), high density plasma CVD (HDP-CVD), high aspect ratio process (HARP), or flowable CVD (FCVD)), atomic layer deposition (ALD), another suitable technique, and/or a combination thereof.

A patterned mask layer 112 is formed over the dielectric layer 110, as shown in FIG. 2B, in accordance with some embodiments. The patterned mask layer 112 vertically covers and/or overlaps the p-type wells 104P and 106P, in accordance with some embodiments. In some embodiments, the patterned mask layer 112 has trench patterns exposing the dielectric layer 110. In some embodiments, the patterned mask layer 112 is a patterned photoresist layer, a patterned hard mask layer, or a combination thereof.

For example, a bottom anti-reflective coating (BARC) material is formed over the dielectric layer 110 using a deposition process, and a photoresist may be formed on the BARC material, such as by using spin-on coating. The BARC material may contain silicon, nitrogen, carbon, oxygen, another suitable element, and/or a combination thereof. The photoresist is then patterned with trench patterns (e.g., aligned over to the n-type wells 104N and 106N) by exposing the photoresist to light using an appropriate photomask. Exposed or unexposed portions of the photo resist may be removed depending on whether a positive or negative resist is used. The trench patterns of the photoresist may then be transferred to the BARC material, such as by using an etching process, e.g., an anisotropic etching process such as dry plasma etching.

Figure 2C:
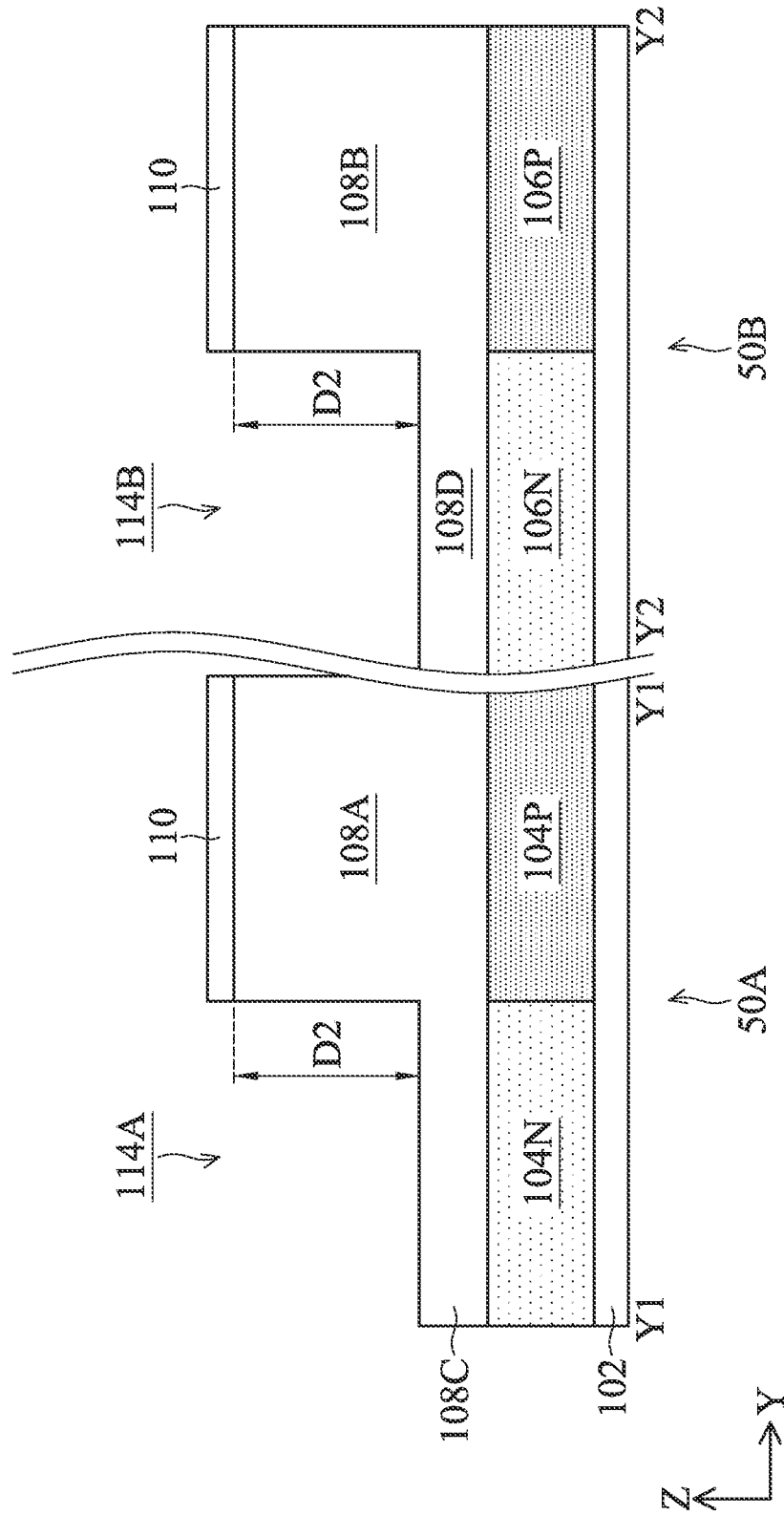

FIG. 2C illustrates a semiconductor structure after an etching process, in accordance with some embodiments.

An etching process is performed using the patterned mask layer 112 to etch away portions of the dielectric layer 110 and the semiconductor material 108 uncovered by the patterned mask layer 112, as shown in FIG. 2C, in accordance with some embodiments. The etching process may be an anisotropic etching process such as dry plasma etching, an isotropic etching process such as dry chemical etching, remote plasma etching, wet chemical etching, and/or a combination thereof. The patterned mask layer 112 is removed during the etching process or by an additional process (such as etching, wet strip and/or aching), in accordance with some embodiments.

The trench patterns of the patterned mask layer 112 are transferred to the semiconductor material 108, thereby forming a trench 114A in the logic area 50A and a trench 114B in the memory cell area 50B, in accordance with some embodiments. The trench 114A is aligned over the n-type well 104N, and the trench 114B is aligned over the n-type well 106N, in accordance with some embodiments. In some embodiments, the trench 114A and the trench 114B have the same etching depth D2 in a range from about 25 nm to about 150 nm.

In some embodiments, in the logic area 50A, an unetched portion of the semiconductor material 108, protected by the patterned mask layer 112, is denoted as 108A, and the portion 108A is located directly above the p-type well 104P. In some embodiments, in the logic area 50A, a remaining portion of the semiconductor material 108 directly below the trench 114A is denoted as 108C, and the portion 108C is located directly above the n-type well 104N.

In some embodiments, in the memory cell array area 50B, an unetched portion of the semiconductor material 108, protected by the patterned mask layer 112, is denoted as 108B, and the portion 108B is located directly above the p-type well 106P. In some embodiments, in the memory cell array area 50B, a remaining portion of the semiconductor material 108 directly below the trench 114B is denoted as 10813, and the portion 108D is located directly above the n-type well 106N.

Figure 2D:
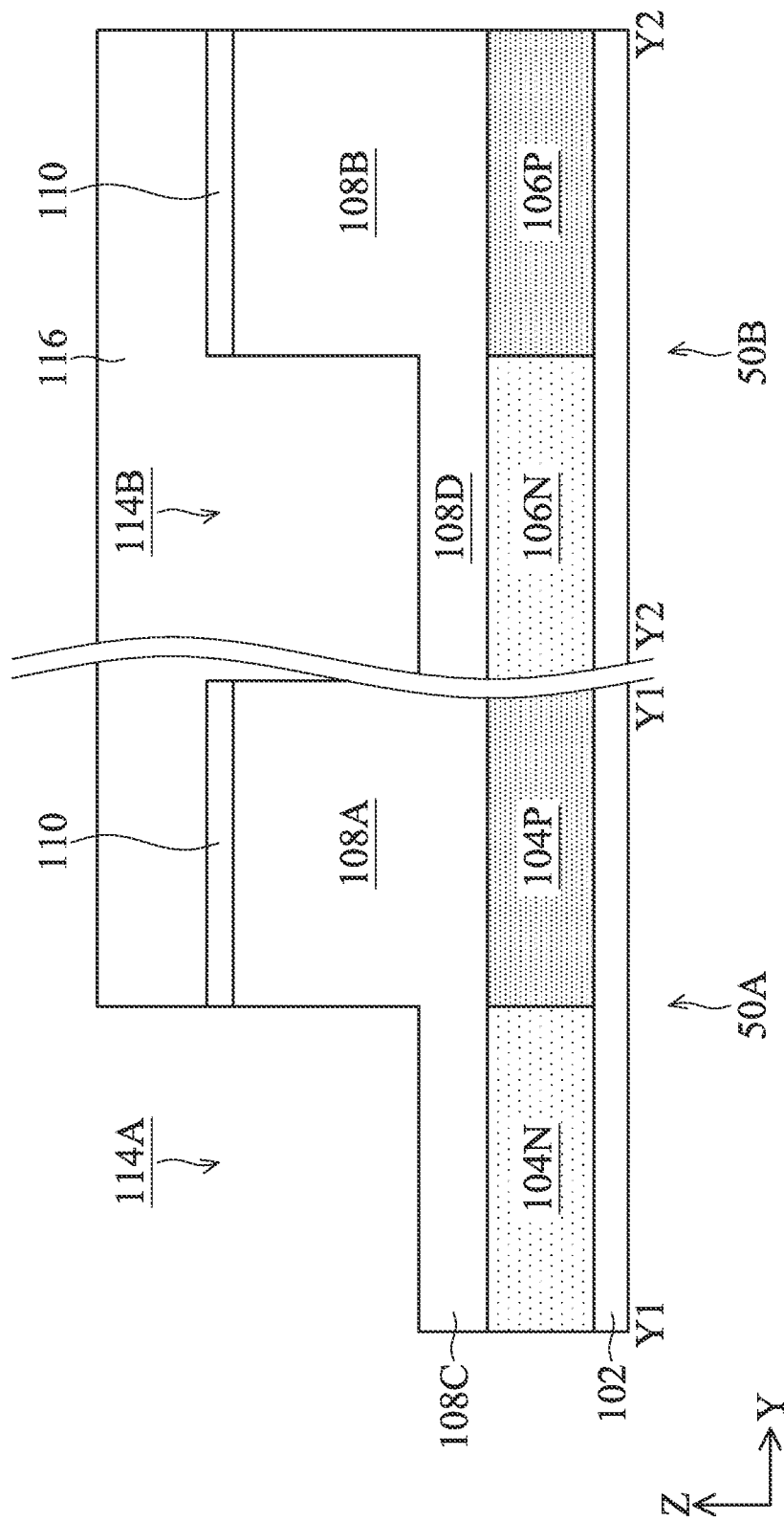

FIG. 2D illustrates a semiconductor structure after the formation of a patterned mask layer 116, in accordance with some embodiments.

A patterned mask layer 116 is formed over the semiconductor structure of FIG. 2C, as shown in FIG. 2D, in accordance with some embodiments. The patterned mask layer 116 vertically covers and/or overlaps the p-type well 104P in the logic area 50A and the n-type well 106N and the p-type well 106P in the memory cell array area 50B, in accordance with some embodiments. In some embodiments, the trench 114B is overfilled by the patterned mask layer 116, In some embodiments, the patterned mask layer 116 has a trench pattern exposing the portion 108C of the semiconductor material 108. In some embodiments, the patterned mask layer 116 is a patterned photoresist layer, a patterned hard mask layer, or a combination thereof.

For example, a BARC material is formed over the semiconductor structure of FIG. 2C using a deposition process, and a photoresist may be formed on the BARC material, such as by using spin-on coating. The BARC material may contain silicon, nitrogen, carbon, oxygen, another suitable element, and/or a combination thereof. The photoresist is then patterned with a trench pattern (e.g., aligned over to the n-type well 104N) by exposing the photoresist to light using an appropriate photomask. Exposed or unexposed portions of the photo resist may be removed depending on whether a positive or negative resist is used. The trench pattern of the photoresist may then be transferred to the BARC material, such as by using an etching process, e.g., an anisotropic etching process such as dry plasma etching.

Figure 2E:
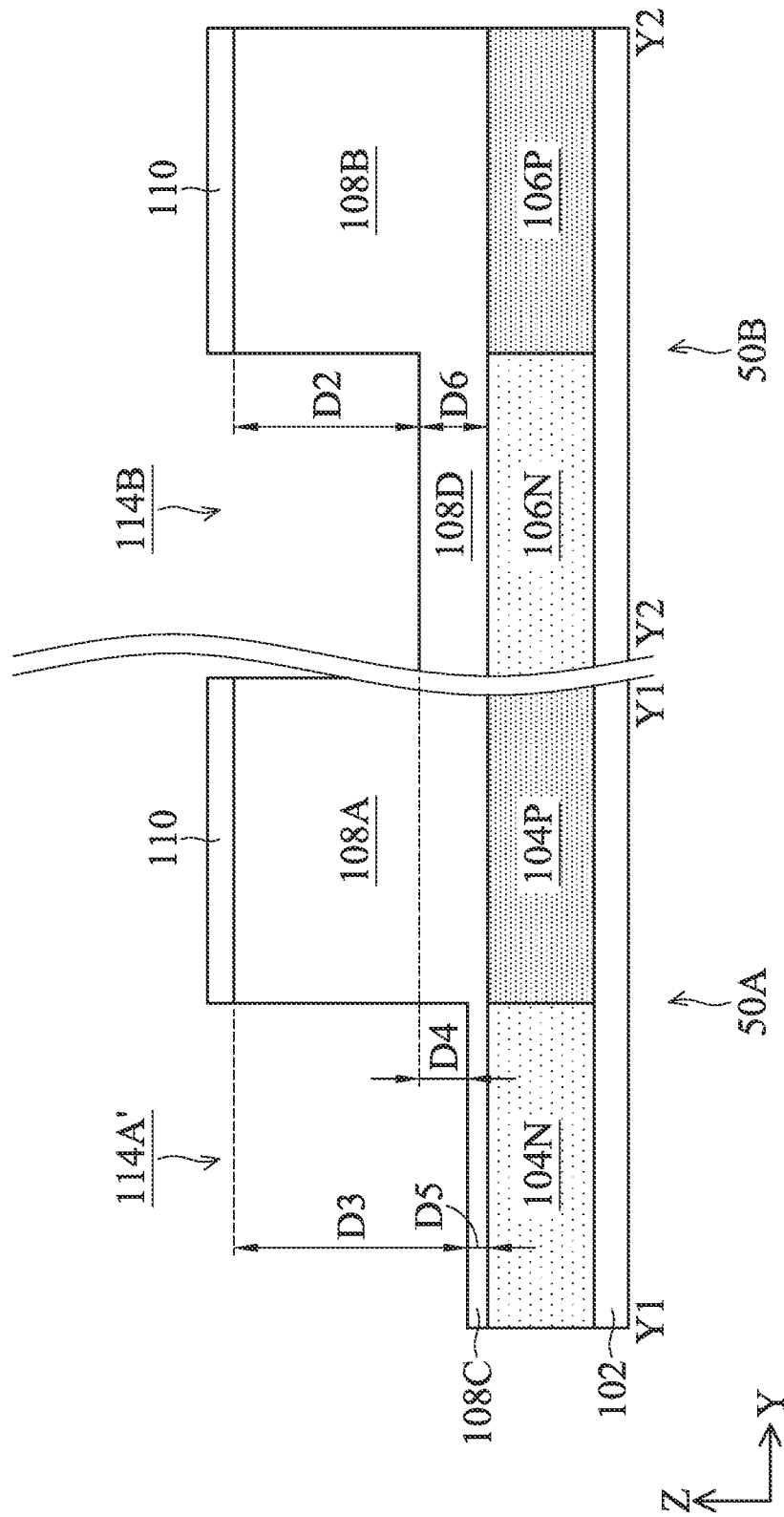

FIG. 2E illustrates a semiconductor structure after an etching process, in accordance with some embodiments.

An etching process is performed using the patterned mask layer 116 to recess the portion 108C of the semiconductor material 108 that is uncovered by the patterned mask layer 116, as shown in FIG. 2E, in accordance with some embodiments. The etching process may be an anisotropic etching process such as dry plasma etching, an isotropic etching process such as dry chemical etching, remote plasma etching, wet chemical etching, and/or a combination thereof. The patterned mask layer 116 is removed during the etching process or by an additional process (such as etching, wet strip and/or ashing), in accordance with some embodiments.

As a result, the trench 114A is enlarged and denoted as 114X, in accordance with some embodiments. In some embodiments, the trench 114A' has an etching depth D3 in a range from about 27.5 nm to about 165 nm. In some embodiments, the trench 114A' is deeper than the trench 114B by a dimension D4. In some embodiments; the dimension D4 is in a range from about 2.5 nm to about 15 nm.

In some embodiments, the recessed portion 108C of the semiconductor material 108 has a thickness D5. In some embodiments, the thickness D5 is in a range from about 1 nm to about 35 nm. In alternatively embodiments, the portion 108C of the semiconductor material 108 may be entirely removed in the etching process (i.e., D5 is zero). In sonic embodiments, the portion 108D of the semiconductor material 108 is thicker than the portion 108C of the semiconductor material 108 and has a thickness D6. In some embodiments, the thickness D6 is in a range from about 2.5 nm to about 50 nm.

Figure 2F:
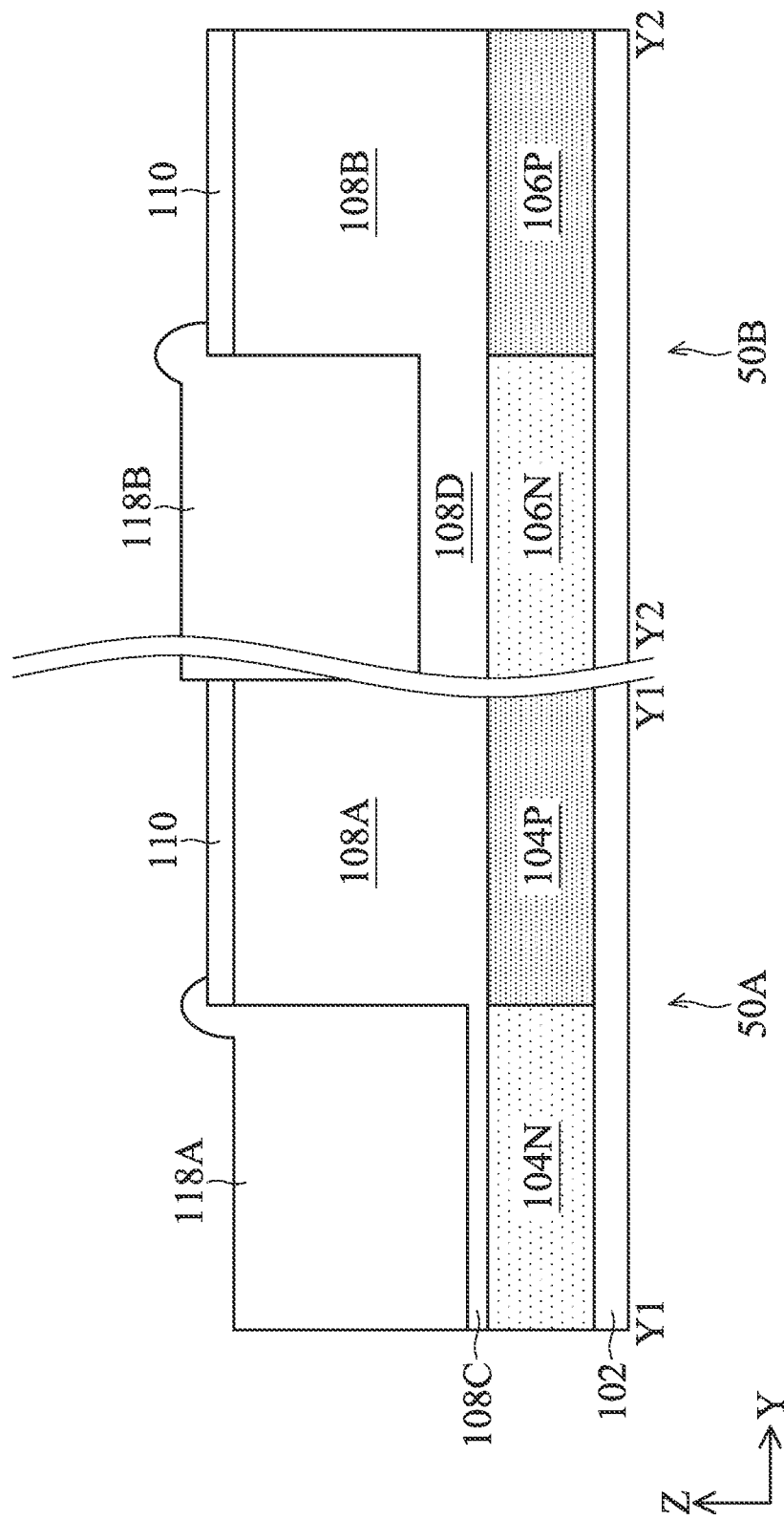

FIG. 2F illustrates a semiconductor structure after the formation of semiconductor materials 118A and 118B, in accordance with some embodiments.

A semiconductor material 118 (including 118A and 118B) is formed to fill the trenches 114A' and 11413, as shown in FIG. 2E, in accordance with some embodiments. The semiconductor material 118A is formed in the trenches 114K and covers the portion 108C of the semiconductor material 108, and the semiconductor material 118E is formed in the trenches 114B and covers the portion 108D of the semiconductor material 108 in accordance with some embodiments.

In some embodiments, the semiconductor material 118 is silicon germanium ($Side_y$), where y is greater than about 20%, e.g., ranging from about 20% to about 45%. The concentrations of the impurity (or the dopant) in the semiconductor material 118 is less than the concentrations of the dopants in the wells 104N, 104P, 106N and 106P, in accordance with some embodiments. For example, the concentrations of the impurity (or the dopant) in the semiconductor material 118 is less than $10^{14}/cm^{-3}$.

In some embodiments, the semiconductor material 118 is grown from the semiconductor surface provided from the semiconductor material 108 using an epitaxial growth process. The epitaxial growth process may be MBE, MOCVD, or VPE, or another suitable technique. The upper surface of the semiconductor material 118A is located a position substantially level to or higher than the top surface of the portion 108A of the semiconductor material 108, in accordance with some embodiments. The upper surface of the semiconductor material 118D is located a higher position than the top surface of the portion 108B of the semiconductor material 108 and the upper surface of the semiconductor material 118A, in accordance with some embodiments.

In sonic embodiments, the semiconductor material 118 is difficult to grow on the dielectric material. Therefore, after the epitaxial growth is completed, the semiconductor material 118 covers only edge portions of the top surface of the dielectric layer 110, in accordance with some embodiments.

Figure 2G:
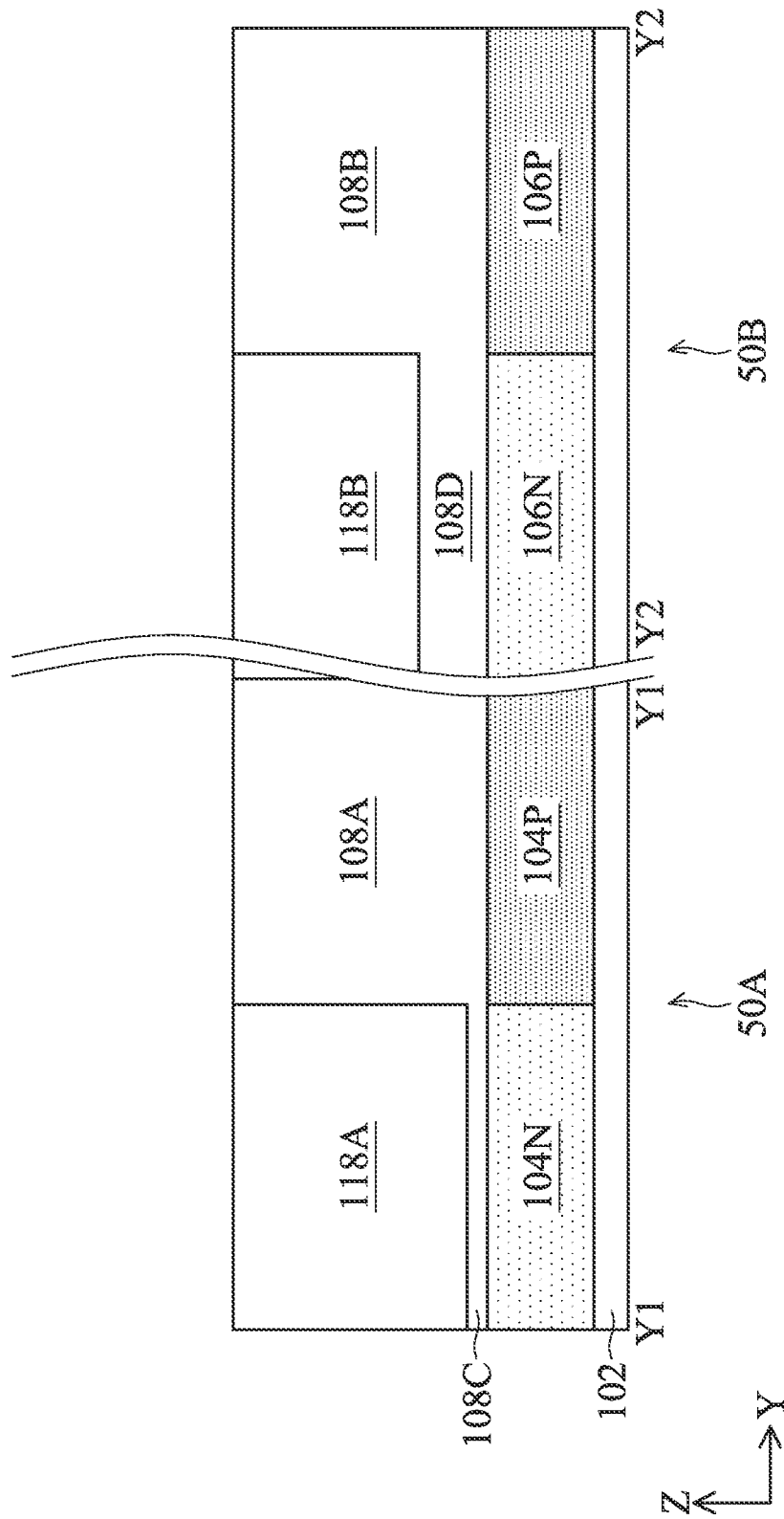

FIG. 2G illustrates a semiconductor structure after a planarization process, in accordance with some embodiments.

A planarization process may be performed on the semiconductor structure of FIG. 2F to expose the portions 108A and 108B of the semiconductor materials 108, as shown in FIG. 2G, in accordance with some embodiments. The planarization process may be chemical mechanical polishing (CMP) or an etching-back process. In the planarization process, the dielectric layer 110 is entirely removed, in accordance with some embodiments. After the planarization process, the top surfaces of the semiconductor material 108A and 108B and the semiconductor material 118A and 118B are substantially coplanar, in accordance with some embodiments.

Figures 1, 2H:
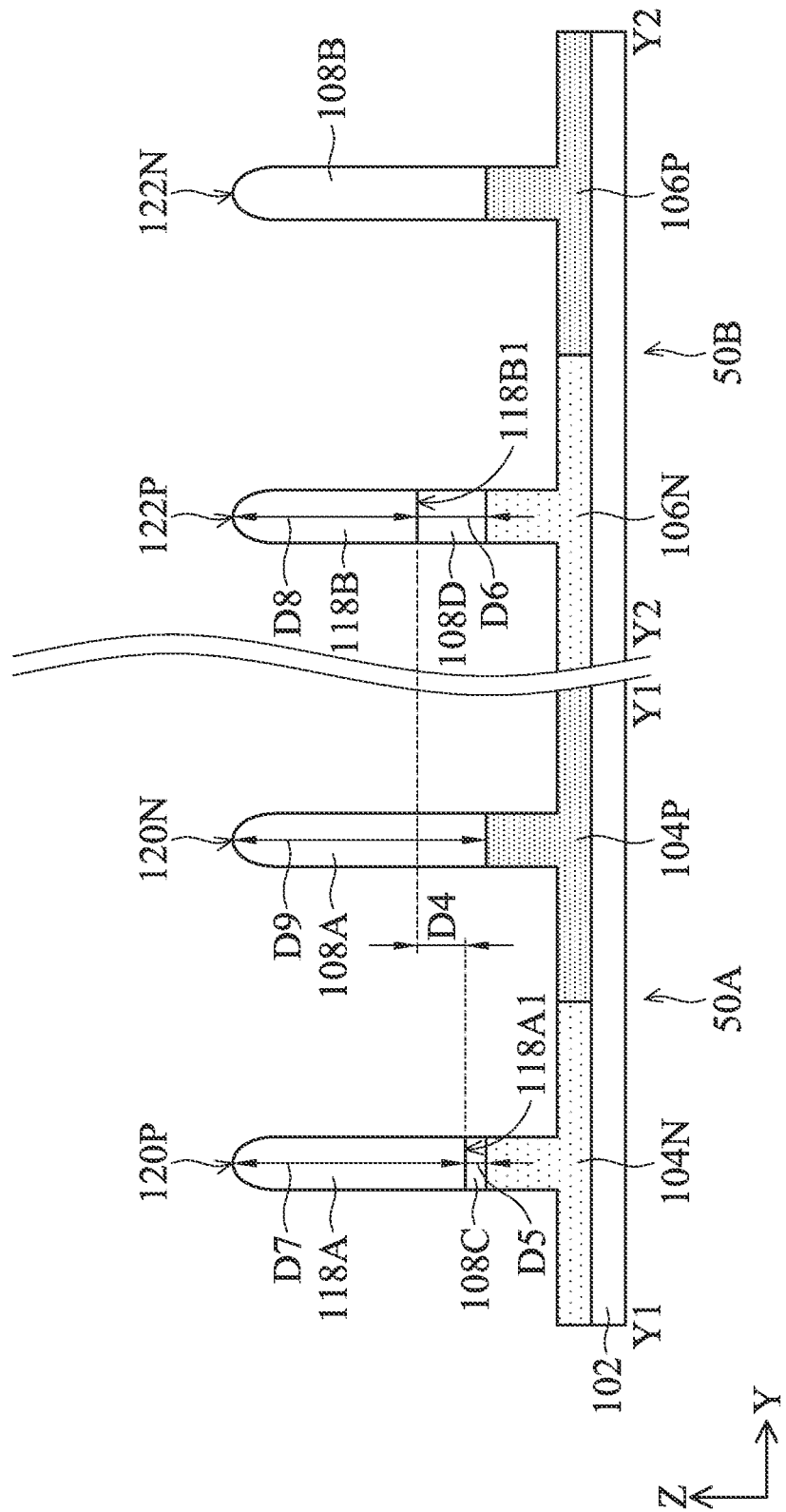
Figures 2, 2H:
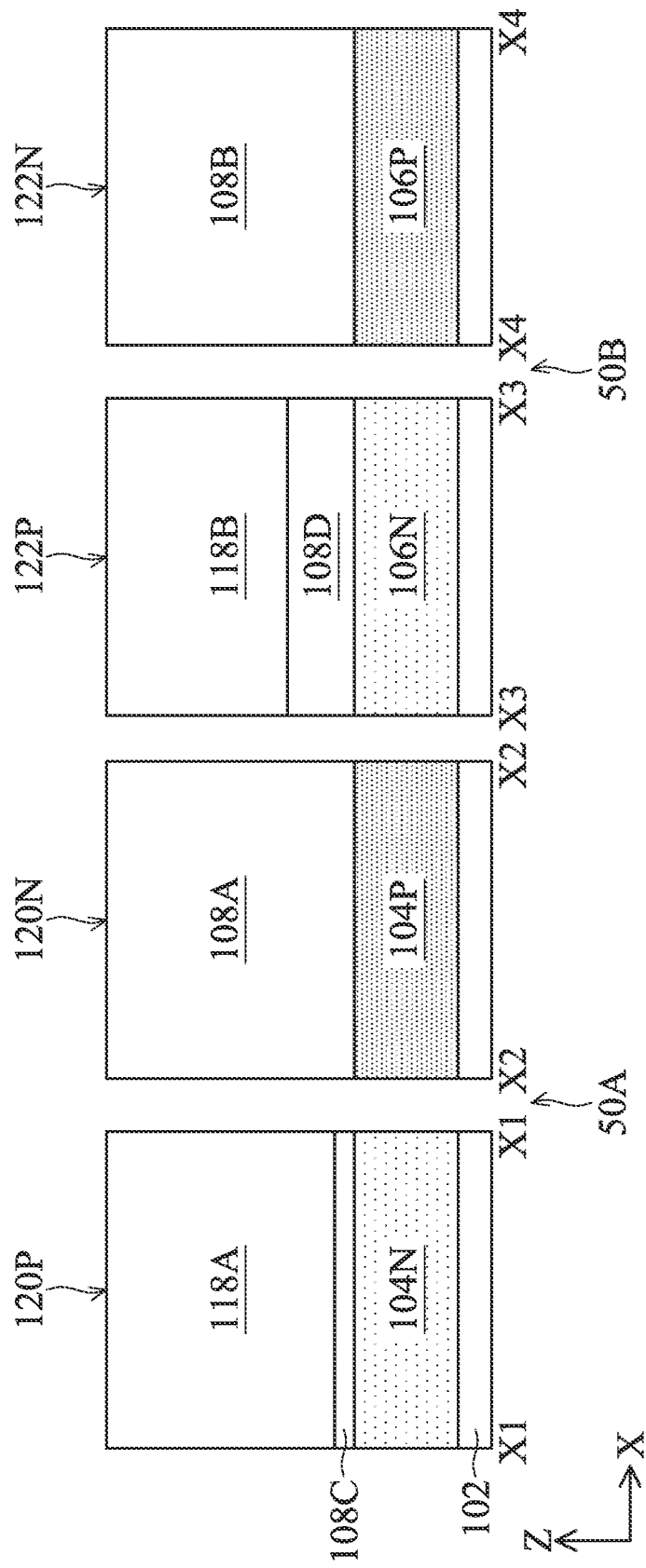

FIGS. 2H-1 and 2H-2 illustrate a semiconductor structure after the formation of fin structures 120P, 120N, 122P and 122N, in accordance with some embodiments.

The semiconductor structure of FIG. 2G is patterned to form fin structures 120P, 120N, 122P and 122N, as shown in FIGS. 2H-1 and 2H-2, in accordance with some embodiments. In the logic area 50A, the fin structure 120P is formed over the n-type well 104N and the fin structure 120N is formed over the p-type well 104P, in accordance with some embodiments. In the memory cell array area 50B, the fin structure 122P is formed over the n-type well 106N and the fin structure 122N is formed over the p-type well 106P, in accordance with some embodiments. Although FIG. 2H-1 illustrates that a single fin structure is formed in a single well, more than one fin structure may be formed in a single well.

In some embodiments, the patterning process for forming the fin structures 120P. 120N, 122P and 122N includes forming a patterned mask layer (not shown) over the semiconductor structure of FIG. 2G. The patterned mask layer may be a patterned photoresist layer, a patterned hard mask layer, or a combination thereof.

The patterning process further includes performing an etching process to etch away portions of the semiconductor materials 118A and 118B and the semiconductor materials 108A, 108B, 108C and 108D, and wells 104N, 104P, 106N and 106P uncovered by the patterned hard mask layer, thereby forming trenches and the fin structures 120P, 120N. 122P and 122N protruding from between the trenches, in accordance with some embodiments. The etching process may be an anisotropic etching process, e.g., dry plasma etching. The patterned mask layer may be removed during the etching process or by an additional process (such as etching, wet strip and/or ashing), in accordance with sonic embodiments.

The fin structure 120P includes, from bottom to top, a bottom fin element formed from the n-type well 104N, a middle fin element formed from the semiconductor material 108C, and a top fin element formed from the semiconductor material 118A, in accordance with some embodiments. In alternative embodiments where the semiconductor material 108C is entirely removed, the fin structure 120P has no middle fin element.

The fin structure 120N includes, from bottom to op, a bottom fin element formed from the p-type well 104P and a top fin element formed from the semiconductor material 108A, in accordance with some embodiments.

The fin structure 122P includes, from bottom to top, a bottom fin element formed from the n-type well 106N, a middle fin element formed from the semiconductor material 108D, and a top fin element formed from the semiconductor material 118B, in accordance with some embodiments.

The fin structure 122N includes, from bottom to top, a bottom fin element formed from the p-type well 106P and a top fin element formed from the semiconductor material 108B, in accordance with some embodiments.

In some embodiments, the top fin element 118A of the fin structure 120P has a thickness D7 in a range from about 27.5 nm to about 165 nm. In some embodiments, the top fin element 118B of the fin structure 122P has a thickness D8 in a range from about 25 nm to about 150 nm. In some embodiments, the thickness D7 is greater than the thickness D8 by the dimension D4 is in a range from about 2.5 nm to about 15 nm. In some embodiments, the bottom surface 118A1 of the top fin element 118A is located at a lower position than the bottom surface 118B1 of the top fin element 118B.

In some embodiments, the middle fin element 108C of the fin structure 120P has a thickness D5 in a range from about 1 nm to about 35 nm. In sonic embodiments, the middle fin element 108D of the fin structure 122P has a thickness D6 in a range from about 2.5 nm to about 50 nm. In some embodiments, the thickness D5 is less than the thickness D6 by the dimension D4.

In some embodiments, the top fin element 108A (or 108B) of the fin structure 120N (or 122N) has a thickness D9 in a range from about 27.5 nm to about 200 nm. In some embodiments, the thickness D9 of the top fin element 108A (or 108B) is greater than the thickness D7 of the top fin element 118A and the thickness D8 of the top fin element 118B.

In some embodiments, the fin structures 120P, 120N, 122P and 122P have rounded tops. In alternative embodiments, the fin structures 120P, 120N, 122P and 122P have pointed tops or substantially flat top surfaces. In some embodiments, the tops of the fin structures 120P, 120N, 122P and 122P are located in substantially the same position.

Figures 1, 2I:
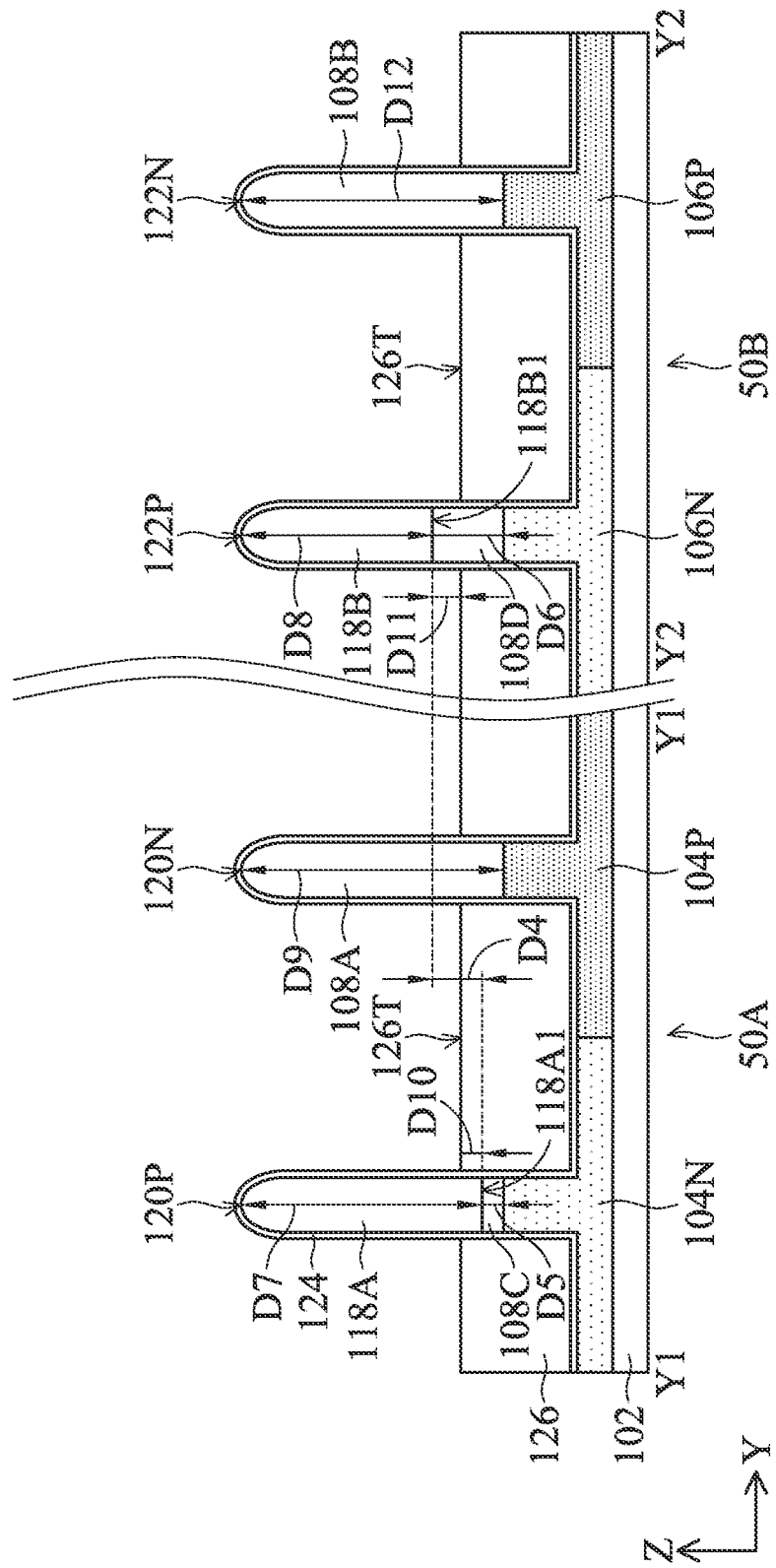
Figures 2, 2I:
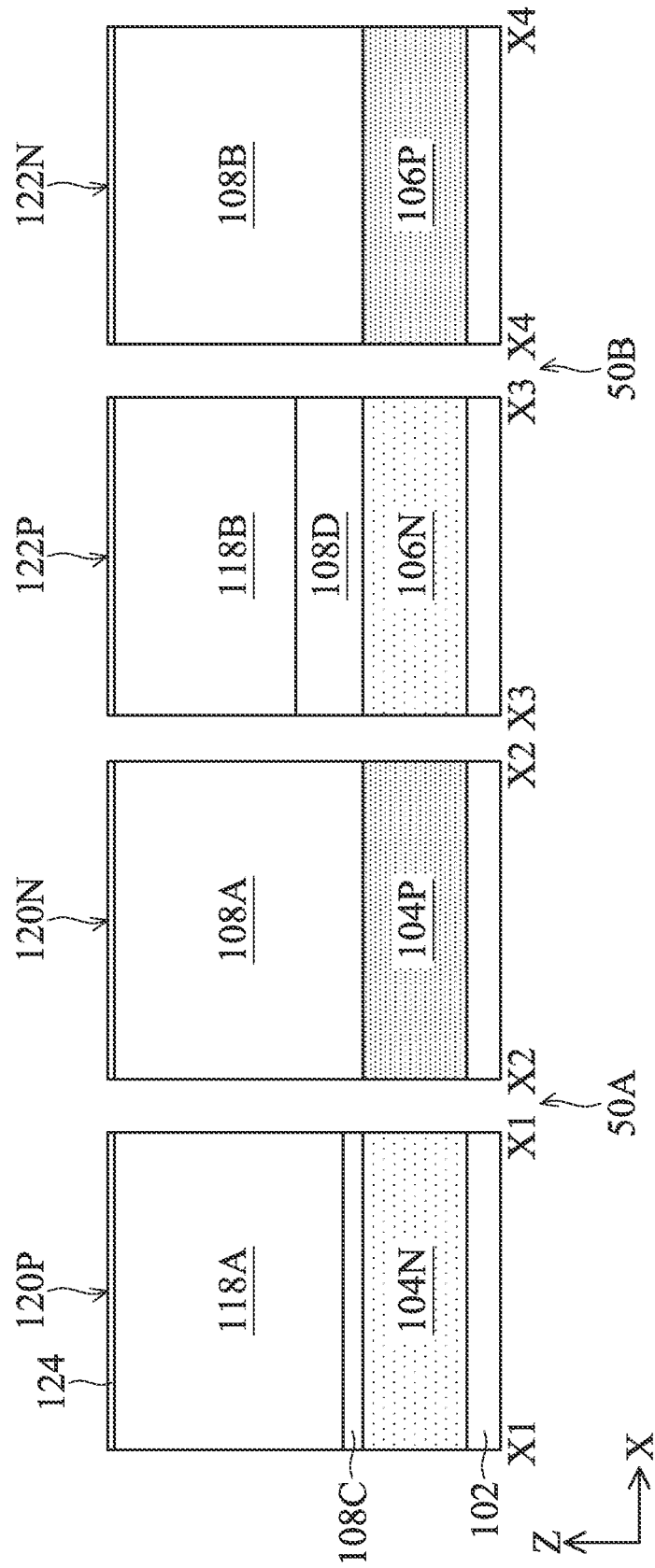

FIGS. 2I-1 and 2I-2 illustrate a semiconductor structure after the formation of a semiconductor capping layer 124 and an isolation structure 126, in accordance with some embodiments.

A semiconductorcapping layer 124 is formed along the semiconductor structure of FIGS. 1H-1 and 1H-2, as shown in FIGS. 2I-1 and 2I-2, in accordance with some embodiments. The semiconductor capping layer 124 covers and extends along sidewalls and the tops the fin structures 120P, 120N, 122P and 122P and the upper surfaces of the wells 104N, 104P, 106N and 106P, in accordance with some embodiments. In some embodiments, the semiconductor capping layer 124 is made of silicon. In some embodiments, the semiconductor capping layer 124 is deposited using CVD, ALD, another suitable deposition technique, and/or a combination thereof.

In some embodiments, the semiconductor capping layer 124 has a thickness in a range from about 2 nm to about 15 nm. The semiconductor capping layer 124 is configured to reduce the crystalline defects on the exposed etched surface of the top fin elements 118A and 118B of the fin structures 120P and 122P (eg., repairing the dangling bond), thereby improving the mobility of the carrier of the resulting semiconductor device, in accordance with some embodiments.

An isolation structure 126 is formed over the semiconductor capping layer 124 to partially surround the fin structures 120P, 120N, 122P and 122P, as shown in FIG. 2I-1, in accordance with some embodiments. The isolation structure 126 may be also referred to as shallow trench isolation (STI) feature In some embodiments, the isolation structure 126 is made of dielectric material such as silicon oxide ($SiO_2$), silicon nitride (SiN), silicon oxvnitride (SiON), silicon carbide (SiC), oxygen-doped silicon carbide (SiC:O), oxygen-doped silicon carbonitride (Si(O)CN), or a combination thereof.

In some embodiments, the formation of the isolation structure 126 includes depositing a dielectric material for the isolation structure 126 to overfill the trenches. In some embodiments, the dielectric material is deposited using chemical vapor deposition (CVD) (such as FCVD, LPCVD, PECVD, HDP-CVD, or HARP), ALD, another suitable technique, and/or a combination thereof.

The dielectric material formed over the tops of the fin structures 120P, 120N, 122P and 122P is planarized to expose the tops of the fin structures 120P, 120N, 122E and 122P, for example, using CMP, etching back process, or a combination thereof, in accordance with some embodiments.

The dielectric material is further recessed to expose the sidewalls of the fin structures 120P, 120N, 122P and 122P, in accordance with some embodiments. The recessing process may be an anisotropic etching process such as dry plasma etching, an isotropic etching process such as dry chemical etching, remote plasma etching or wet chemical etching, and/or a combination thereof. A remainder of the dielectric material serves as the isolation structure 126, in accordance with some embodiments.

In some embodiments, the top surface 126T of the isolation structure 126 is substantially flat. In alternative embodiments, the top surface 126I of the isolation structure 126 is curved (e.g., concave). In some embodiments, the top surface 126I of the isolation structure 126 is located at a position that is higher than the bottom surface 118A1 of the top fin element 118S of the fin structure 120P and lower than the bottom surface 118B1 of the top fin element 118B of the fin structure 122P.

A distance D10 between the top surface 126T of the isolation structure 126 and the bottom surface 118A1 of the top fin element 118A is in a range from about 1 nm to about 12 nm. A distance D11 between the top surface 126T of the isolation structure 126 and the bottom surface 118B1 of the top fin element 118B is in a range from about 1 nm to about 12 nm. The distance D10 may be greater than, equal to, or less than the distance D11. In some embodiments, the position of the top surface 126T of the isolation structure 126 may be adjusted in accordance with the performance requirements of the p-channel transistors (formed on the fin structures 120P and 122P), e.g., On-current (Ion), drain current in linear region (Id), channel resistance ($R_{CH}$), parasitic capacitance, short channel effect (SCE), drain-induced barrier lowering (DIBL), etc. This will be discussed in detail later.

Figures 1, 2J:
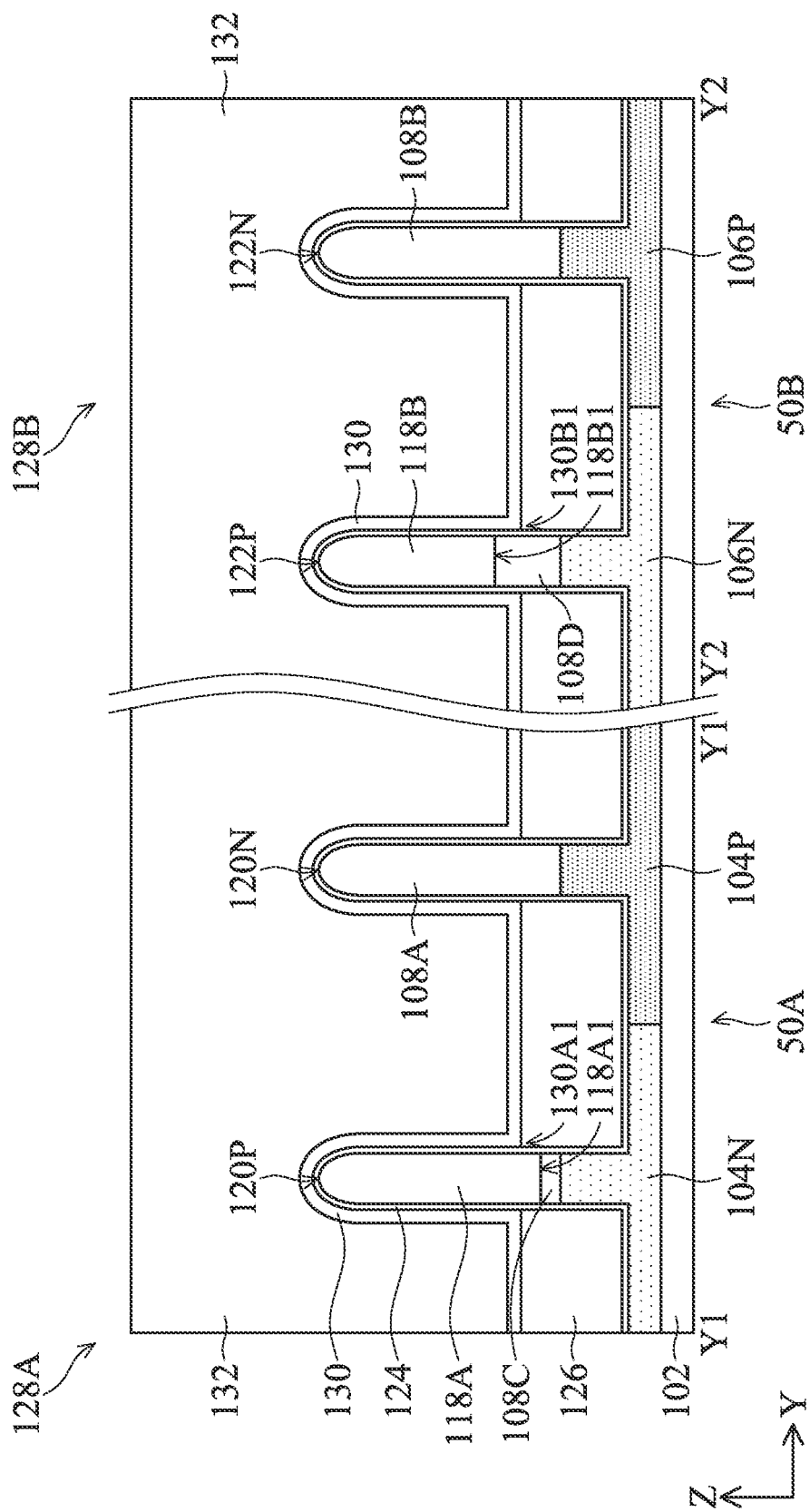
Figures 2, 2J:
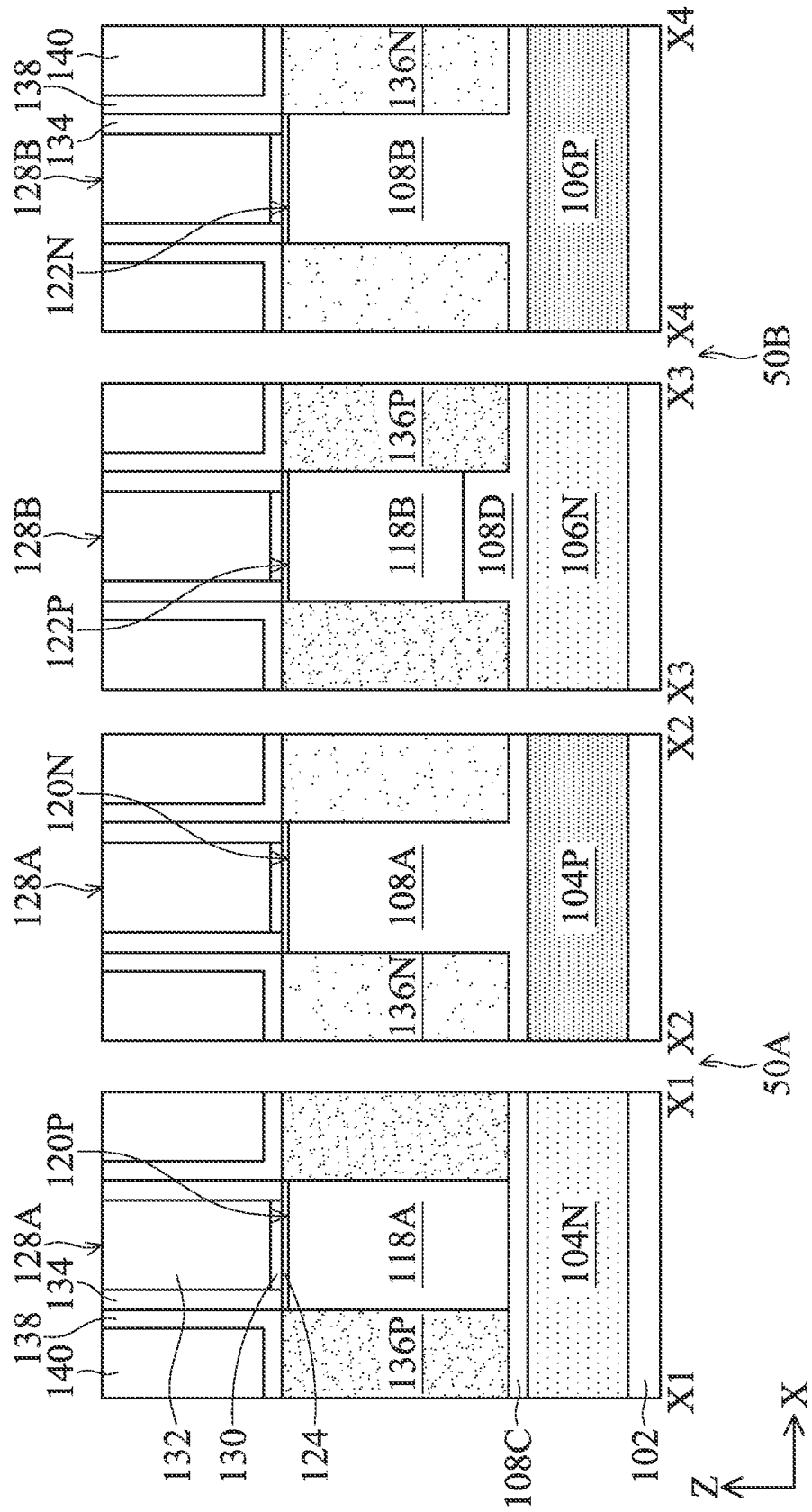

FIGS. 2J-1 and 2J-2 illustrate a semiconductor structure after the formation of dummy gate structures 128A and 128B, gate spacer layers 134, source/drain features 136N and 136P, contact etching stop layer (CESL) 138, and interlayer dielectric (IMD) layer 140, in accordance with some embodiments.

A dummy gate structure 128 (including 128A and 128B) is formed over the semiconductor structure of FIGS. 2I-1 and 2I-2, as shown in FIGS. 2J-1 and 2J-2, in accordance with some embodiments. The dummy gate structure 128A is formed in the logic area 50A and extends across and surrounds the channel regions of the fin structures 120P and 120N, in accordance with sonic embodiments. The dummy gate structure 128B is formed in the memory cell array area 50B and extends across and surrounds the channel regions of the fin structures 122P and 122N, in accordance with some embodiments. The dummy gate structures 128A and 128B define the channel region and the source/drain regions of the fin structures, in accordance with some embodiments.

In some embodiments, the dummy gate structures 128A and 128B extend in the Y direction. That is, the dummy gate structures 128A and 128B have longitudinal axes parallel to the Y direction, in accordance with some embodiments. The dummy gate structures 128A and 128B may be a single, continuous gate structure, or may be spaced apart from one another. The dummy gate structure 12$ is configured as a sacrificial structure and will be replaced with a final gate stack, in accordance with some embodiments.

The dummy gate structure 128 includes a dummy gate dielectric layer 130 and a dummy gate electrode layer 132 formed over the dummy gate dielectric layer 130, as shown in FIGS. 2J-1 and 2J-2, in accordance with some embodiments. In some embodiments, the dummy gate dielectric layer 130 is made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof.

In some embodiments, the dummy gate electrode layer 132 is made of semiconductor material such as poly-silicon, poly-silicon germanium. In some embodiments, the dummy gate electrode layer 132 is made of a conductive material such as metallic nitrides, metallic silicides, metals, and/or a combination thereof. In some embodiments, the material for the dummy gate electrode layer 132 is formed using CVD, another suitable technique, and/or a combination thereof.

In some embodiments, the formation of the dummy gate structure 128 includes globally and conformally depositing a dielectric material for the dummy gate dielectric layer 130 over the semiconductor structure, depositing a material for the dummy gate electrode layer 132 over the dielectric material, planarizing the material for the dummy gate electrode layer 132, and patterning the dielectric material and the material for the dummy gate electrode layer 132 into the dummy gate structure 128.

The patterning process includes forming a patterned hard mask layer (not shown) over the material for the dummy gate electrode layer 132 to vertically cover the channel regions of the fin structures 120P, 120N, 122P and 122N, in accordance with some embodiments. The material for the dummy gate electrode layer 132 and the dielectric material, uncovered by the patterned hard mask layer, is etched away until the source/drain regions of the fin structures 120P, 120N, 122P and 122N are exposed, in accordance with some embodiments.

The top fin element 118A of the fin structure 120P extends downward beyond the dummy gate structure 128A, as shown in FIG. 2J-1, in accordance with some embodiments. In specific, the dummy gate dielectric layer 130 has a vertical portion extending along the sidewall of the top fin element 118A, and the bottom 130A1 of the vertical portion of the dummy gate dielectric layer 130 is located at a higher position than the bottom surface 118A1 of the top fin element 118A, in accordance with some embodiments.

The top fin element 118B of the fin structure 122P is encapsulated in the dummy gate structure 128B, as shown in FIG. 2J-1, in accordance with some embodiments. In specific, the dummy gate dielectric layer 130 has a vertical portion extending along the sidewall of the top fin element 118B, and the bottom 130B1 of the vertical portion of the dummy gate dielectric layer 130 is located at a lower position than the bottom surface 118B1 of the top fin element 118B, in accordance with some embodiments.

Gate spacer layers 134 are formed along the sidewalls of the dummy gate structure 128, as shown in FIG. 2J-2, in accordance with some embodiments. The gate spacer layers 134 are used to offset the subsequently formed source/drain features and separate the source/drain features from the gate structure, in accordance with some embodiments. In some embodiments, the gate spacer layers 134 are made of dielectric material, such as silicon oxide ($SiO_2$), silicon nitride (SiN), silicon carbide (SiC), silicon oxynitride (SiON), silicon carbon nitride (SiCN), silicon oxycarhonitride (SiOCN), and/or oxygen-doped silicon carbonitride (Si(O)CN).

In some embodiments, the formation of the gate spacer layer 134 includes globally and conformally depositing a dielectric material for the gate spacer layer 134 over the semiconductor structure, followed by an anisotropic etching process. In some embodiments, the etching process is performed without an additional photolithography process. Remaining portions of the dielectric material on the sidewalls of the dummy gate structure 128 serve as the gate spacer layers 134, in accordance with some embodiments.

N-type source/drain features 136N and p-type source/drain features 136P are formed over the semiconductor structure, as shown in FIG. 2J-2, in accordance with some embodiments. The p-type source/drain features I36P are formed in fin structures 120P and 122P at the source/drain regions, in accordance with some embodiments. The n-type source/drain features 136N are formed in fin structures 120N and 122N at the source/drain regions, in accordance with some embodiments.

The formation of the source/drain features 136N and 136P includes recessing the fin structures 120P, 120N, 122P and 122N using the dummy gate structure 128 and gate spacer layers 134 as an etching mask to form source/drain recesses at the source/drain regions, in accordance with some embodiments. The bottom surfaces of the source/drain recesses may extend to a position lower than the top surface 126T of the isolation structure 126, For example, the bottom surfaces of the source/drain recesses are substantially level with the bottom surface 118A1 of the top fin element 118A, in accordance with some embodiments.

Afterward, the source/drain features 136N and 136P are grown on the fin structures 120P, 120I, 122P and 122N in the source/drain recesses using epitaxial growth processes, in accordance with some embodiments. The epitaxial growth process may be MBE, MOCVD, or VPE, or another suitable technique. The source/drain features 136P abut the top fin element 118A of the fin structure 120P and the top fin element 118B of the fin structure 122P, in accordance with sonic embodiments. The source/drain features 136N abut the top fin element 108A of the fin structure 120N and the top fin element 108B of the fin structure 122N, in accordance with some embodiments.

In some embodiments, the n-type source/drain features 136N and the p-type source/drain features 136P are formed separately. For example, a patterned mask layer (such as a photoresist layer and/or hard mask layer) may be formed to cover the semiconductor structure over the n-type wells 104N and 106N, and then the n-type source/drain features 136N are grown. Afterward, the patterned mask layer may be removed.

Similarly, in some embodiments, a patterned mask layer (such as a photoresist layer and/or hard mask layer) is formed to cover the semiconductor structure over the p-type wells 104P and 106P, and then the p-type source/drain features 136P are grown. Afterward, the patterned mask layer may be removed.

In some embodiments, the source/drain features 136N and 136P are in-situ doped during the epitaxial processes. In some embodiments, the respective concentrations of the dopant in the source/drain features 136N and 136P are in a range from about $1\times10^{18}$ cm$^{-3}$ to about $1\times10^{22}$ cm$^{-3}$.

In some embodiments, the n-type source/drain features 136N are doped with the n-type dopant during the epitaxial growth process. For example, the n-type dopant may be phosphorous (P) or arsenic (As). For example, the n-type source/drain features 136N may be the epitaxially grown Si doped with phosphorous to form silicon:phosphor (Si:P) source/drain features and/or arsenic to form silicon:arsenic (Si:As) source/drain feature.

In some embodiments, the p-type source/drain features 136P are doped with the p-type dopant during the epitaxial growth process. For example, the p-type dopant may be boron (B) or BF$_2$. For example, the p-type source/drain features 136P may be the epitaxially grown SiGe doped with boron (B) to form silicon germanium:boron (SiGe:B) source/drain feature. In some embodiments, the n-type source/drain features 136N and the p-type source/drain features 136P are made of different epitaxial materials. For example, the n-type source/drain features 136N are made of SiP, and the p-type source/drain features 136P are made of SiGe.

A contact etching stop layer 138 is formed over the semiconductor structure to cover the source/drain features 136N and 136P, as shown in FIG. 2J-2, in accordance with some embodiments. In some embodiments, the contact etching stop layer 138 is made of dielectric material, such as silicon oxide (SiO$_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, a dielectric material for the contact etching stop layer 138 is globally and conformally deposited using CVD (such as LPCVD, PECVD, HDP-CVD, or HARP). ALD, another suitable method, or a combination thereof.

An interlayer dielectric layer 140 over the contact etching stop layer 138, as shown in FIG. 23-2, in accordance with some embodiments. In some embodiments, the interlayer dielectric layer 140 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 140 and the contact etching stop layer 138 are made of different materials and have a great difference in etching selectivity.

In some embodiments, the dielectric material for the interlayerdielectric layer 140 is deposited using such as CVD (such as HDP-CVD, PECVD, HARP or FCVD), another suitable technique, and/or a combination thereof. The dielectric materials for the contact etching stop layer 138 and the interlayer dielectric layer 140 above the upper surface of the dummy gate structures 128A and 128B are removed using such as CMP, in accordance with some embodiments.

Figures 1, 2K:
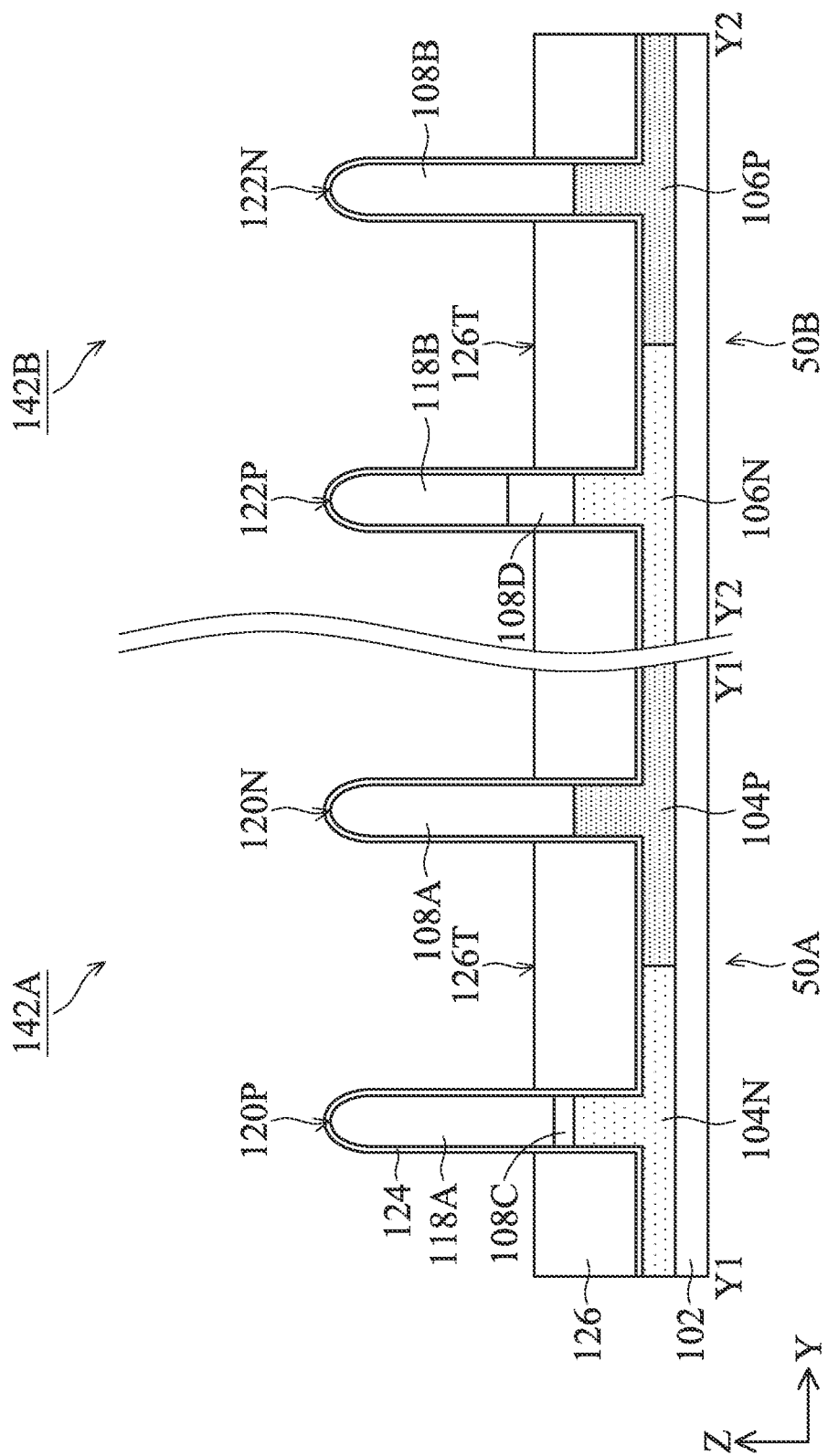
Figures 2, 2K:
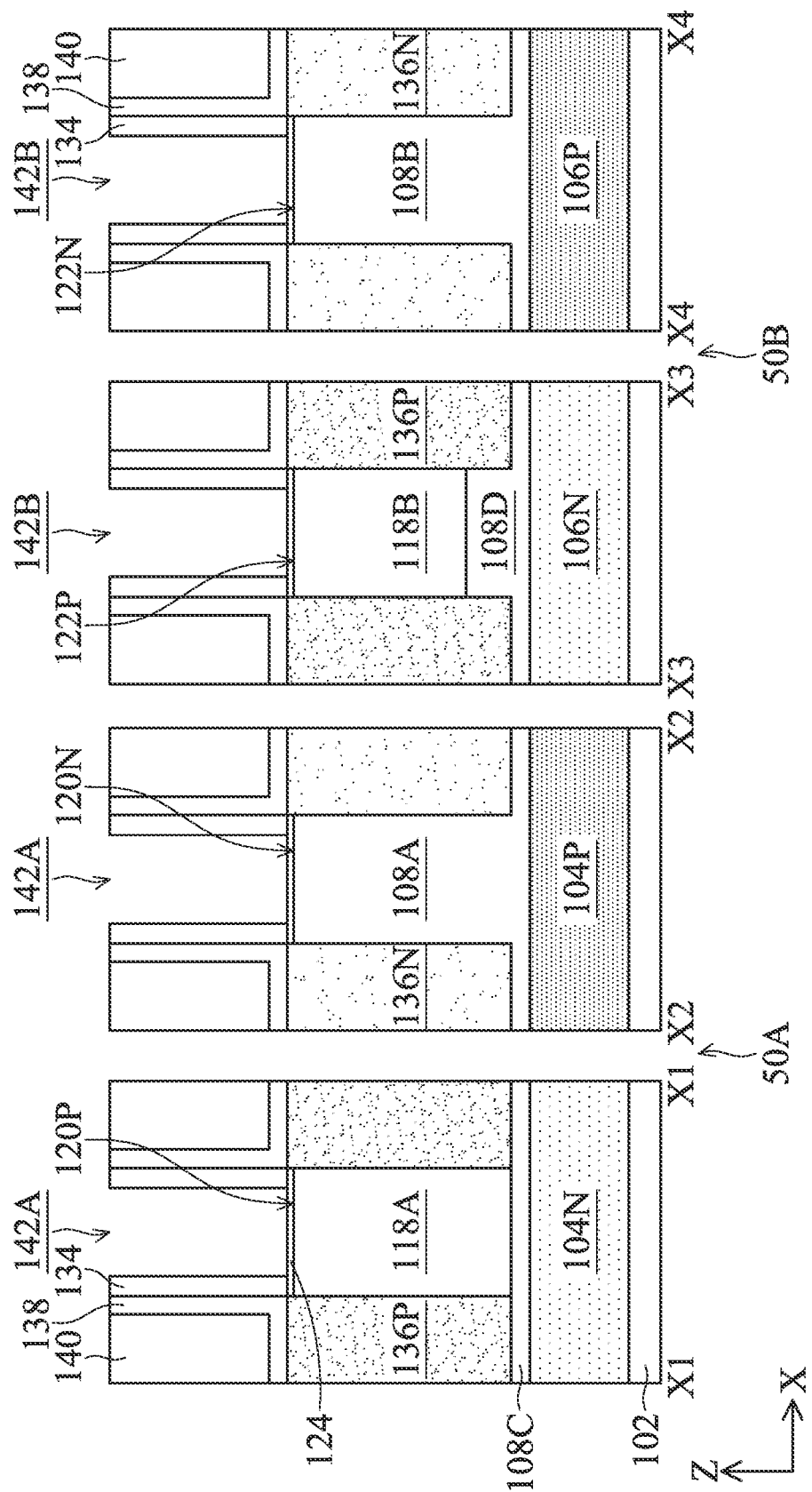

FIGS. 2K-I and 2K-2 illustrate a semiconductor structure after the formation of gate trenches 142A and 142B, in accordance with some embodiments.

The dummy gate structures 128A and 128B are removed using one or more etching processes to form gate trenches 142A and 142B, as shown in FIGS. 2K-1 and 2K-2, in accordance with some embodiments. The semiconductor capping layer 124 is exposed from the dummy gate structures 128A and 128B, in accordance with some embodiments. The dummy gate structures 128A and 128B also expose the top surface 126I of the isolation structure 126, in accordance with some embodiments. The dummy gate structures 128A and 128B also expose the sidewalls of the gate spacer layers 134 facing the channel regions, in accordance with some embodiments.

In some embodiments, the etching process includes one or more etching processes. For example, when the dummy gate electrode layer 132 is made of polysilicon, a wet etchant such as a tetramethylammonium hydroxide (TMAH) solution may be used to selectively remove the dummy gate electrode layer 132. For example, the dummy gate dielectric layer 132 may be thereafter removed using a plasma dry etching, a dry chemical etching, and/or a wet etching.

Figures 1, 2L:
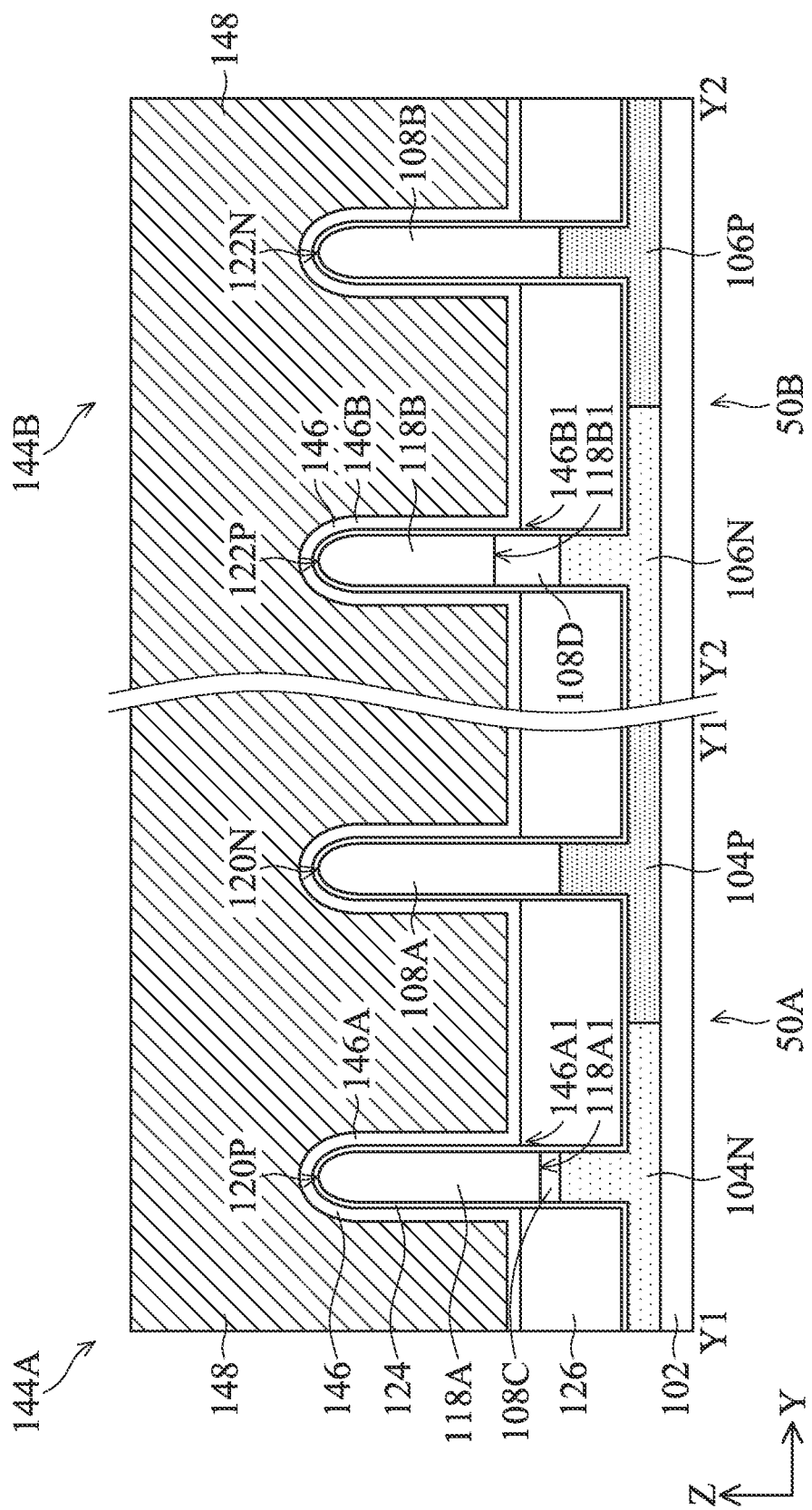
Figures 2, 2L:
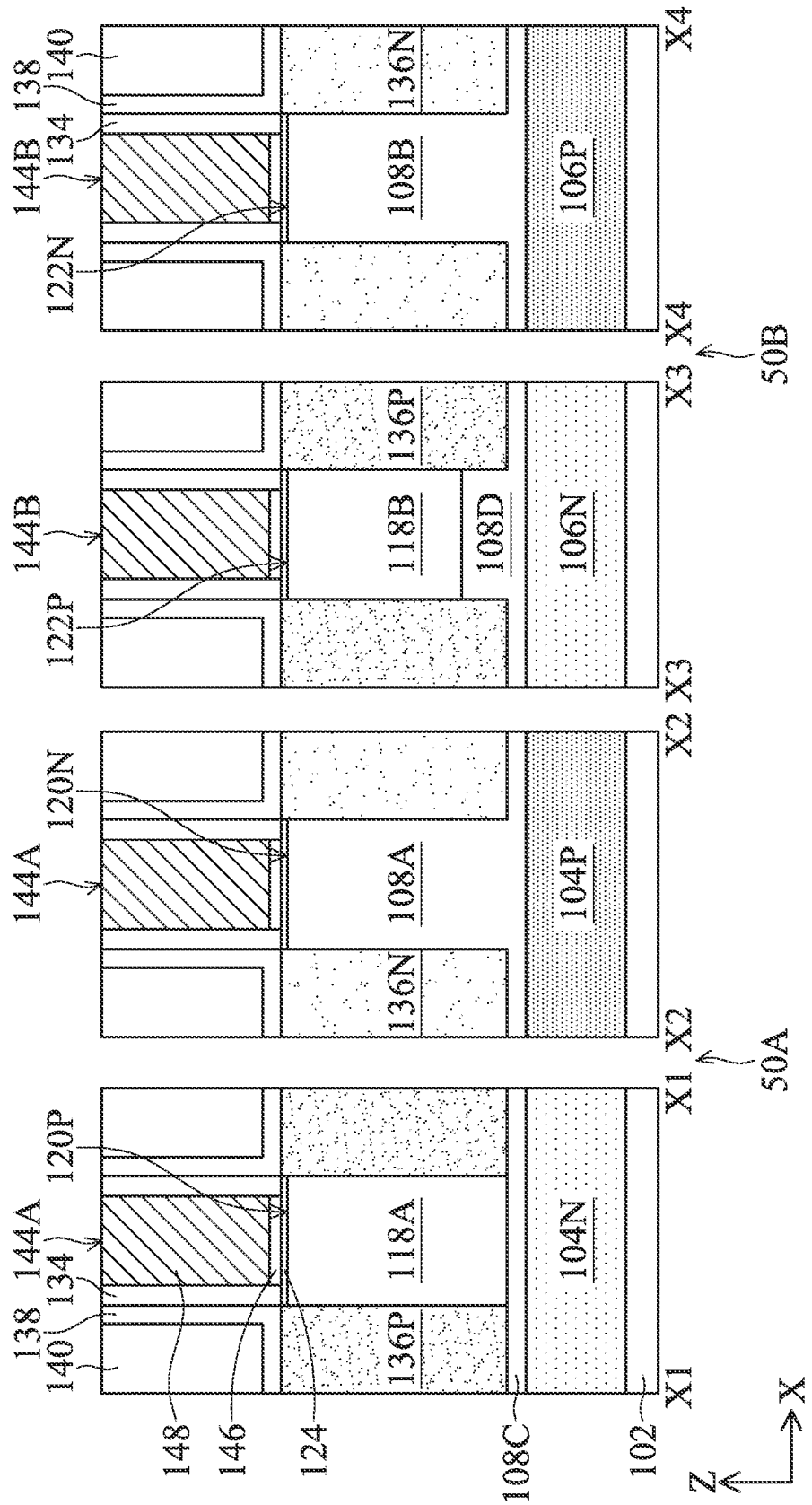

FIGS. 2L-1 and 2L-2 illustrate a semiconductor structure after the formation of final gate stacks 144A and 144B, in accordance with some embodiments.

Final gate stacks 144A and 144B are formed in the gate trenches 142A and 142B, as shown in F1Gs. 2L-1 and 2L-2, in accordance with some embodiments. The final gate stack 144A is formed in the logic area 50A and extends across and surrounds the channel regions of the fin structures 120P and 120N, in accordance with some embodiments. The final gate stack 144B is formed in the memory cell array area 50B and extends across and surrounds the channel regions of the fin structures 122P and 122N, in accordance with sonic embodiments.

In some embodiments, the final gate stacks 144A and 144B extend in the Y direction. That is, the final gate stacks 144A and 144B have longitudinal axes parallel to the Y direction, in accordance with some embodiments. The final gate stacks 144A and 144B may be a single, continuous gate stack; or may be spaced apart from one another by another isolation feature.

In some embodiments, each of the final gate stacks 144A and 144B includes a gate dielectric layer 146 and a gate electrode layer 148 formed over the gate dielectric layer 146, as shown in FIGS. 2L-1 and 2L-2, in accordance with some embodiments. The gate dielectric layer 146 is formed to partially fill the gate trenches 142A and 142B, in accordance with some embodiments. In some embodiments, the gate dielectric layer 146 may be an I/O (input/output) oxide which is made of silicon oxide.

In some embodiments, the gate dielectric layer 146 may include an interfacial layer and a high-k dielectric layer formed over the interfacial layer. The interfacial layer may be made of a chemically formed silicon oxide by one or more cleaning processes such as including ozone ($O_3$), ammonia hydroxide-hydrogen peroxide-water mixture, and/or hydrochloric acid-hydrogen peroxide-water mixture.

In some embodiments, the high-k dielectric layer is made of dielectric material with high dielectric constant (k value), for example, greater than 3.9. In some embodiments, the high-k dielectric layer includes hafnium oxide ($HfO_2$), $TiO_2$, HfZrO, $Ta_2O_5$, $HfSiO_4$, $ZrO_2$, $ZrSiO_2$, LaO, AlO, ZrO, TiO, $Y_2O_3$, $SrTiO_3$ (STO), $BaTiO_3$ (BTO), BaZrO, HfSiO, LaSiO, AlSiO, HfTaO, HMO, $(Ba,Sr)TiO_3$ (BST), $Al_2O_3$, oxynitrides (SiON), a combination thereof, or another suitable material. The high-k dielectric layer may be deposited using ALD, PVD, CVD, and/or another suitable technique.

The metal gate electrode layer 148 is formed to fill remainders of the gate trenches 142A and 142B, in accordance with some embodiments. In some embodiments, the metal gate electrode layer 148 is made of more than one conductive material, such as a metal, metal alloy, conductive metal oxide and/or metal nitride, another suitable conductive material, and/or a combination thereof. For example, the metal gate electrode layer 148 may be made of Ti, Ag, TiAlN, TaC, TaCN, TaSiN, Mn, Zr, TiN, TaN, Ru, Mo, WN, Cu, W, Re, Co. Ni, another suitable conductive material, or multilayers thereof.

The metal gate electrode layer 148 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 148 may be formed using AID, PVD, CVD, e-beam evaporation, or another suitable technique. The metal gate electrode layer 148 may be formed separately for n-channel FinFETs and p-channel FinFETs, which may use different work function materials.

A planarization process such as CMP may be performed on the semiconductor structure to remove the materials of the gate dielectric layer 146 and the metal gate electrode layer 148 formed above the upper surface of the interlayer dielectric layer 140, in accordance with some embodiments. After the planarization process, the top surfaces of the metal gate electrode layer 148, the gate spacer layers 134, the contact etching stop layer 138 and the interlayer dielectric layer 140 are substantially coplanar, in accordance with some embodiments.

The top fin element 118A of the fin structure 120P extends downward beyond the final gate stack 144A, as shown in FIG. 2L-1, in accordance with some embodiments. In specific, the gate dielectric layer 146 has a vertical portion extending along the sidewall of the top fin element 118A, and the bottom 146A1 of the vertical portion of the gate dielectric layer 146 is located at a higher position than the bottom surface 118A1 of the top fin element 118A, in accordance with some embodiments.

The top fin element 118B of the fin structure 122P is encapsulated in the final gate stack 144B, as shown in FIG. 2L-1, in accordance with some embodiments. In specific, the gate dielectric layer 146 has a vertical portion extending along the sidewall of the top fin element 118B, and the bottom 146B1 of the vertical portion of the gate dielectric layer 146 is located at a lower position than the bottom surface 118B1 of the top fin element 118B, in accordance with some embodiments.

In the logic area 50A, a portion of the final gate stack 144A surrounding the fin structure 120P combines with the neighboring source/drain features 136P to form a p-channel FinFET, in accordance with some embodiments. The top fin element 118A of the fin structure 120P serves as the channel (e.g., SiGe channel) of the p-channel FinFET, and the final gate stack 144A engages the channel so that current can flow between the source/drain features 136P during operation.

In the logic area 50A, a portion of the final gate stack 144A surrounding the fin structure 120N combines with the neighboring source/drain features 136N to form an n-channel FinFET, in accordance with sonic embodiments. The top fin element 108A of the fin structure 120N serves as the channel (e.g., Si channel) of the n-channel FinFET, and the final gate stack 144A engages the channel so that current can flow between the source/drain features 136N during operation.

In the memory cell array area 50B, a portion of the final gate stack 144B surrounding the fin structure 122P combines with the neighboring source/drain features 136P to form a p-channel FinFET, in accordance with some embodiments. The top fin element 118B of the fin structure 122P serves as the channel (e.g., SiGe channel) of the p-channel FinFET, and the final gate stack 144B engages the channel so that current can flow between the source/drain features 136P during operation. In some embodiments where SRAM cells are formed in the memory cell array area 50B, the p-channel FinFET is used as a pull-up transistor of the SRAM cells.

In the memory cell array area 50B, a portion of the final gate stack 144B surrounding the fin structure 122N combines with the neighboring source/drain features 136N to form an n-channel FinFET, in accordance with some embodiments. The top fin element 108B of the fin structure 122N serves as the channel (e.g., Si channel) of the n-channel FinFET, and the final gate stack 144B engages the channel so that current can flow between the source/drain features 136N during operation. In some embodiments where SRAM cells are formed in the memory cell array area 50B, the n-channel FinFET is used as a pull-down transistor and/or a pass-gate transistor of the SRAM cells.

In accordance with embodiments of the present disclosure, the top fin element 118A of the fin structure 120P, which serves as the channel of the p-type FinFET in the logic area 50A, extends downward beyond the final gate stack 144A, thereby providing a relatively large area of the channel, which may provide benefits, e.g., one or more of (1) greater On-current ($I_{on}$), (2) greater drain current in linear region (Id), (3) lower channel resistance ($R_{CH}$), and (4) lower parasitic capacitance. Thus, the performance of the resulting logic device may be enhanced.

In addition, in accordance with embodiments of the present disclosure, because the top fin element 118B of the fin structure 122P, which serves as the channel of the p-type FinFET (e.g., pull-up transistor for an SRAM cell) in the memory cell array area 50B, is encapsulated in the final gate stack 144B, the final gate stack 144E can have better control over the channel, especially for the bottom portion of the top fin element 118B, which may provide benefits, e.g., improving in SCE and/or DIBL. Thus, the performance of the resulting SRAM device may be enhanced.

Furthermore, the respective performances of the resulting logic device and the resulting SRAM device may be fine-tuned by adjusting the position of the top surface 126T of the isolation structure 126. For example, when the performance of the logic device is more of a concern than the SRAM device, the top surface 126T of the isolation structure 126 may be adjusted to a higher position (e.g., farther away from the bottom surface of the 118A1), For example, when the performance of the SRAM device is more of a concern than the logic device, the top surface 126T of the isolation structure 126 may be adjusted to a lower position (e.g., farther away from the bottom surface of the 118B1), Therefore, the embodiments of the present disclosure may provide great flexibility in turning the respective performances of the logic p-channel device and SRAM p-channel device.

It should be understood that the semiconductor structure of EEGs. 2L-1 and 2L-2 may undergo further CMOS processes to form various features over the semiconductor structure, such as a multilayer interconnect structure (e.g., contact plugs to final gate stacks, contact plugs to source/drain features, conductive vias, metal lines, inter metal dielectric lavers, passivation layers, etc.). In some embodiments, the logic device formed in the logic area 50A inay be electrically connected to the memory device formed in the memory cell array area 50B through the conductive features of the multilayer interconnect structure.

Figure 3:
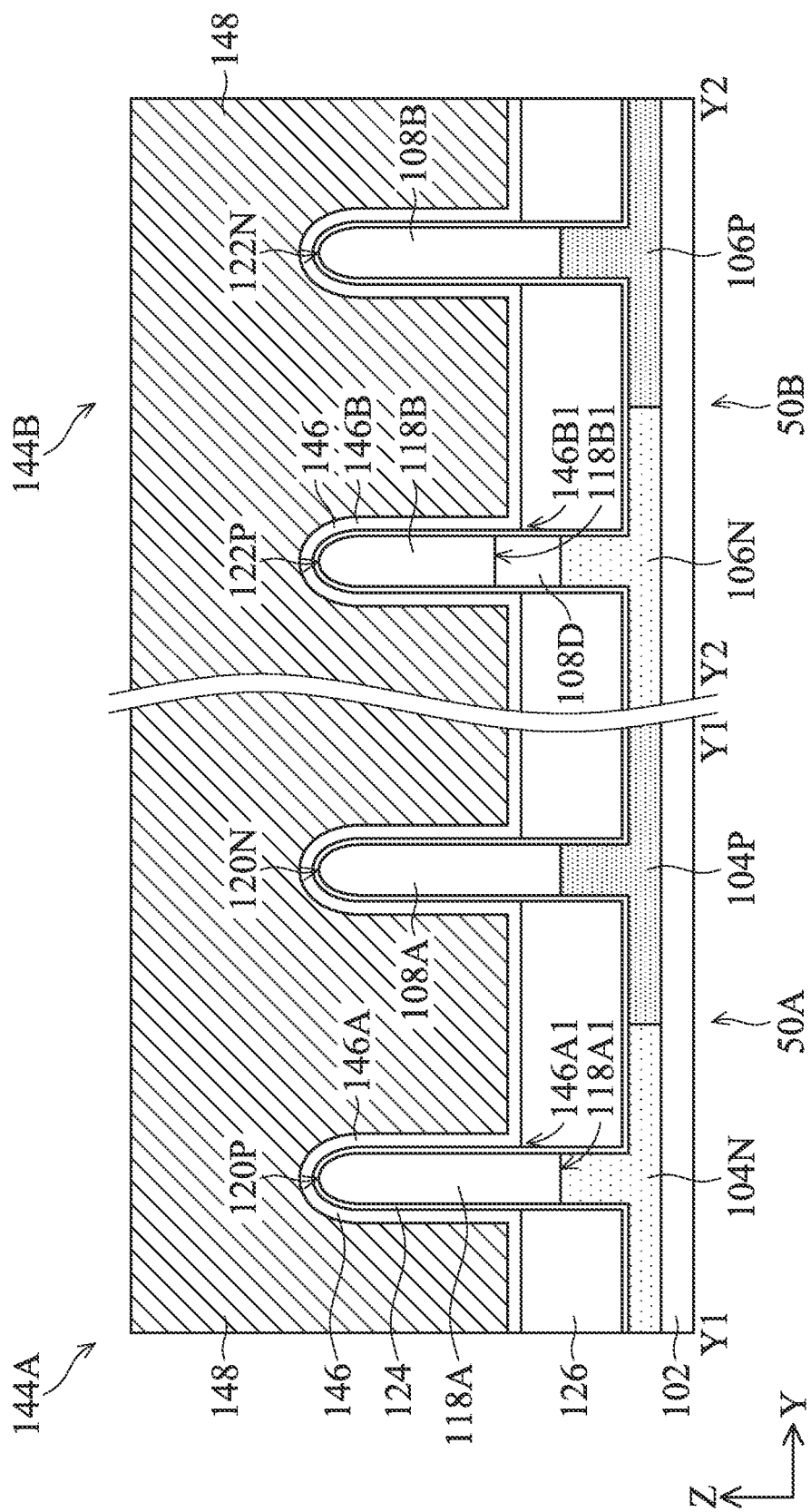
FIG. 3 is a modification of FIG. 2L-1, in accordance with some embodiments of the disclosure.

FIG. 3 is a modification of FIG. 2L-1, in accordance with some embodiments of the disclosure. The semiconductor structure of FIG. 3 is similar to the semiconductor structure of FIG. 2L-1, except that the fin structure 120P shown in FIG. 3 has no middle fin elements.

In some embodiments, the portion 108C (FIG. 2E) of the semiconductor material 108 may be entirely removed in the etching process described above in FIG. 2E (i.e., D5 is zero). The fin structure 120P includes the bottom fin element formed from the n-type well 104, and the top fin element 118A on and in contact with the bottom fin element, as shown in FIG. 3, in accordance with some embodiments.

Figure 4A:
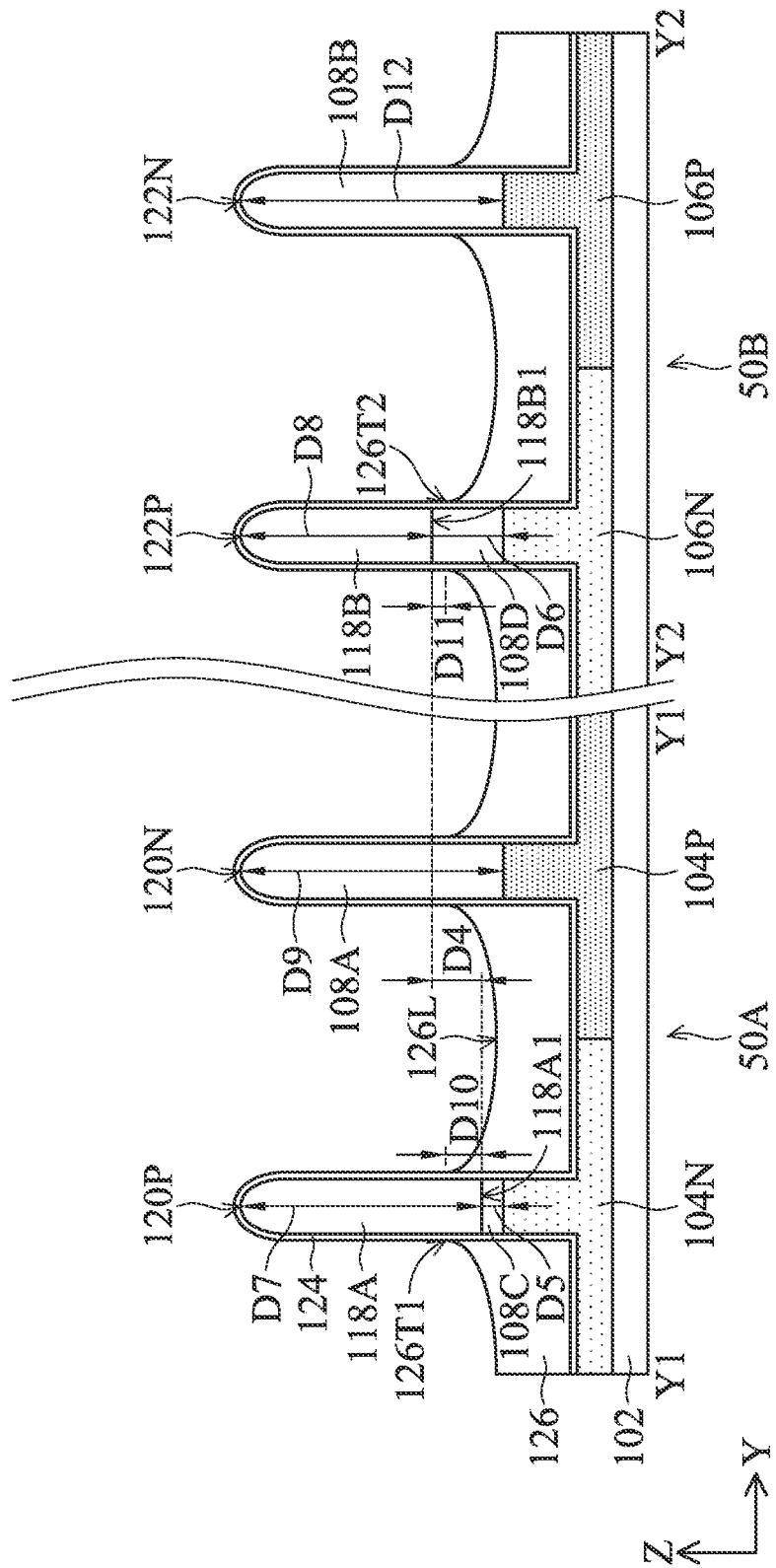
FIGS. 4A and 4B are cross-sectional views illustrating the formation of a semiconductor structure at various intermediate stages, in accordance with some embodiments of the disclosure.
Figure 4B:
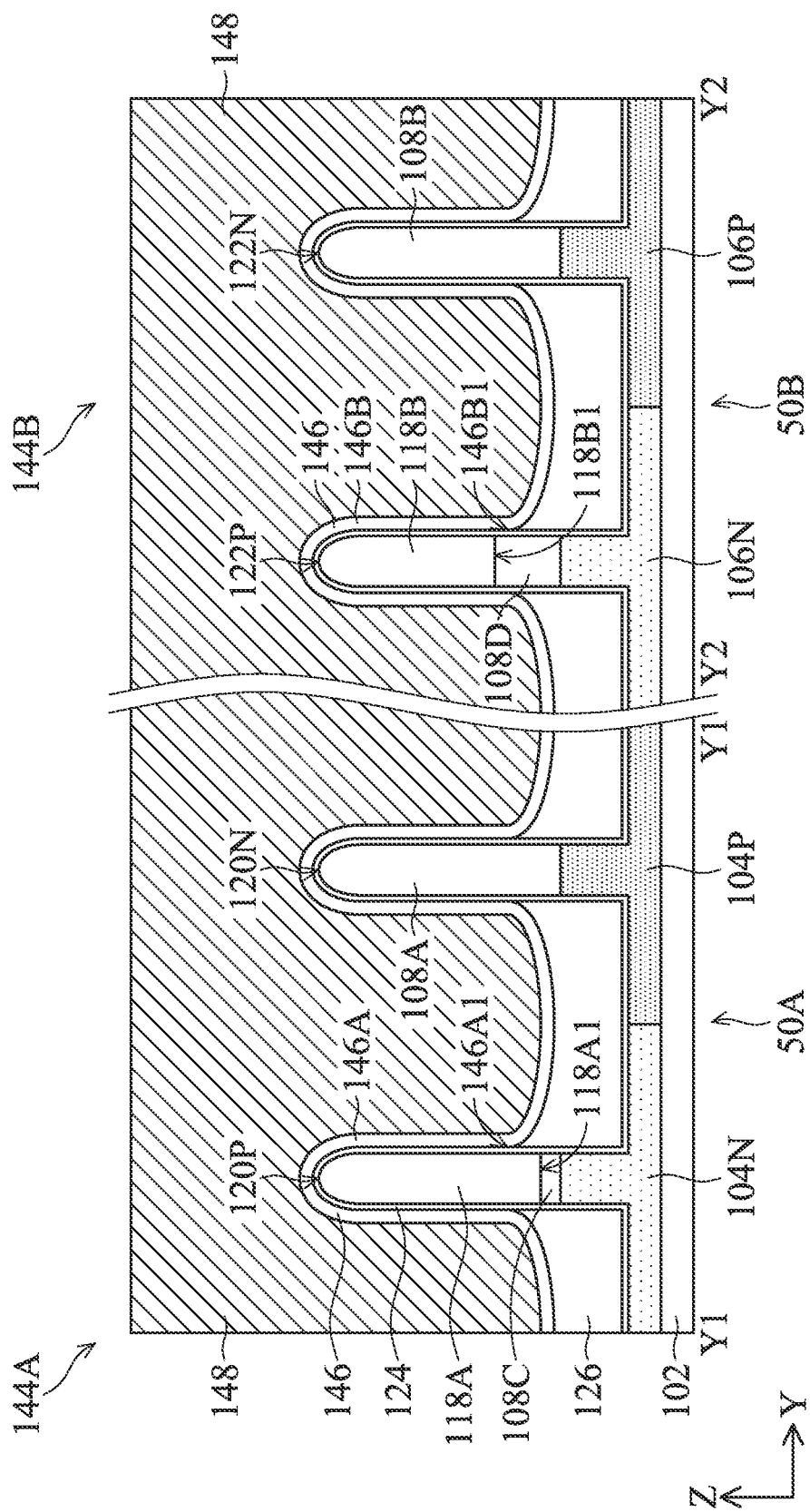

FIGS. 4A and 48 are cross-sectional views illustrating the formation of a semiconductor structure at various intermediate stages, in accordance with some embodiments of the disclosure. FIGS. 4A and 4B correspond to the cross-sections Y1-Y1 and Y2-Y2 of FIG. I. The embodiments of FIGS. 4A and 48 are similar to the embodiments of FIGS. 2A through 2L-2, except that the top surface of the isolation structure 126 shown in FIGS. 4A and 4B is curved.

Continuing from FIGS. 2I-1 and 2I-2, the dielectric material for the isolation structure 126 is recessed to expose the sidewalls of the fin structures 120P, 120N, 122P and 122P, in accordance with some embodiments. Due to the characteristic of the etching process, the top surface of the isolation structure 126 is curved, e.g., concave, as shown in FIG. 4A, in accordance with some embodiments.

In some embodiments, the side surface of the isolation structure 126 facing the fin structure 120P has a top 126T1, and the top 126T1 of the isolation structure 126 is located at a higher position than the bottom surface 118A1 of the top fin element 118A of the fin structure 120P, as shown in FIG. 4A. In some embodiments, the lowest point 126L of the curved top surface of the isolation structure 126 may be located at a lower position than the bottom surface 118A1 of the top fin element 118A of the fin structure 120P.

In sonic embodiments, the side surface of the isolation structure 126 facing the fin structure 122P has a top 126T2, and the top 126T2 of the isolation structure 126 is located at a lower position than the bottom surface 118B1 of the top fin element 118B of the fin structure 122P, as shown in FIG. 4A, in accordance with some embodiments.

In some embodiments, the top 126T1 is spaced apart from the bottom surface 118A1 by a distance D10 in a range from about 1 nm to about 12 nm, and the top 126T2 is spaced apart from the bottom surface 118B1 by a distance D 11 in a range from about nm to about 12 nm. The distance D10 may be greater than, equal to, or less than the distance D11. In some embodiments, the position of the top 126T1 and the position of 126T2 of the isolation structure 126 may be adjusted in accordance with the respective performances of the logic p-channel device and SRAM p-channel device.

The steps described above with respect to FIGS. 2J.-1 through 2L-2 are performed, thereby forming the gate spacer layers 134, the source/drain features 136N and 136P, the contact etching stop layer 138, the interlayer dielectric layer 140, and the final gate stacks 144A and 144B, as shown in FIG. 4B, in accordance with some embodiments.

The top fin element 118A of the fin structure 120P extends downward beyond the final gate stack 144A, in accordance with some embodiments. The gate dielectric layer 146 has a vertical portion extending along the sidewall of the top fin element 118A, and the bottom 146A1 of the vertical portion of the gate dielectric layer 146 is located at a higher position than the bottom surface 118A1 of the top fin element 118A, in accordance with some embodiments. In some embodiments, the lowest point of the gate dielectric layer 146 may be located at a lower position than the bottom surface 118A1 of the top fin element 118A of the fin structure 120P.

The top fin element 118B of the fin structure 122P is encapsulated in the final gate stack 144B, in accordance with some embodiments. In specific, the gate dielectric layer 146 has a vertical portion extending along the sidewall of the top fin element 118B, and the bottom 146131 of the vertical portion of the gate dielectric layer 146 is located at a lower position than the bottom surface 118B1 of the top fin element 118B, in accordance with some embodiments.

FIGS. 5A, 5B, 5C, 5D, 5E, and 5F are cross-sectional views illustrating the formation of a semiconductor structure at various intermediate stages, in accordance with some embodiments of the disclosure. FIGS. 5A-5F correspond to the cross-sections Y1-Y1 and Y2-Y2 of FIG. 1. The embodiments of FIGS. 5A-5F are similar to the embodiments of FIGS. 2A through 2L-2, except the logic area 50A is a pattern loose area and the memory cell array area 50B is a pattern dense area.

Continuing from FIG. 2A, the n-type well 104N and the p-type well 104P are formed in the logic area 50A, while the n-type well 106N and the p-type well 106P are formed in the memory cell array area 50B, in accordance with some embodiments. In some embodiments, the logic area 50A is a pattern loose area and the memory cell array area 50B is a pattern dense area.

Figure 5A:
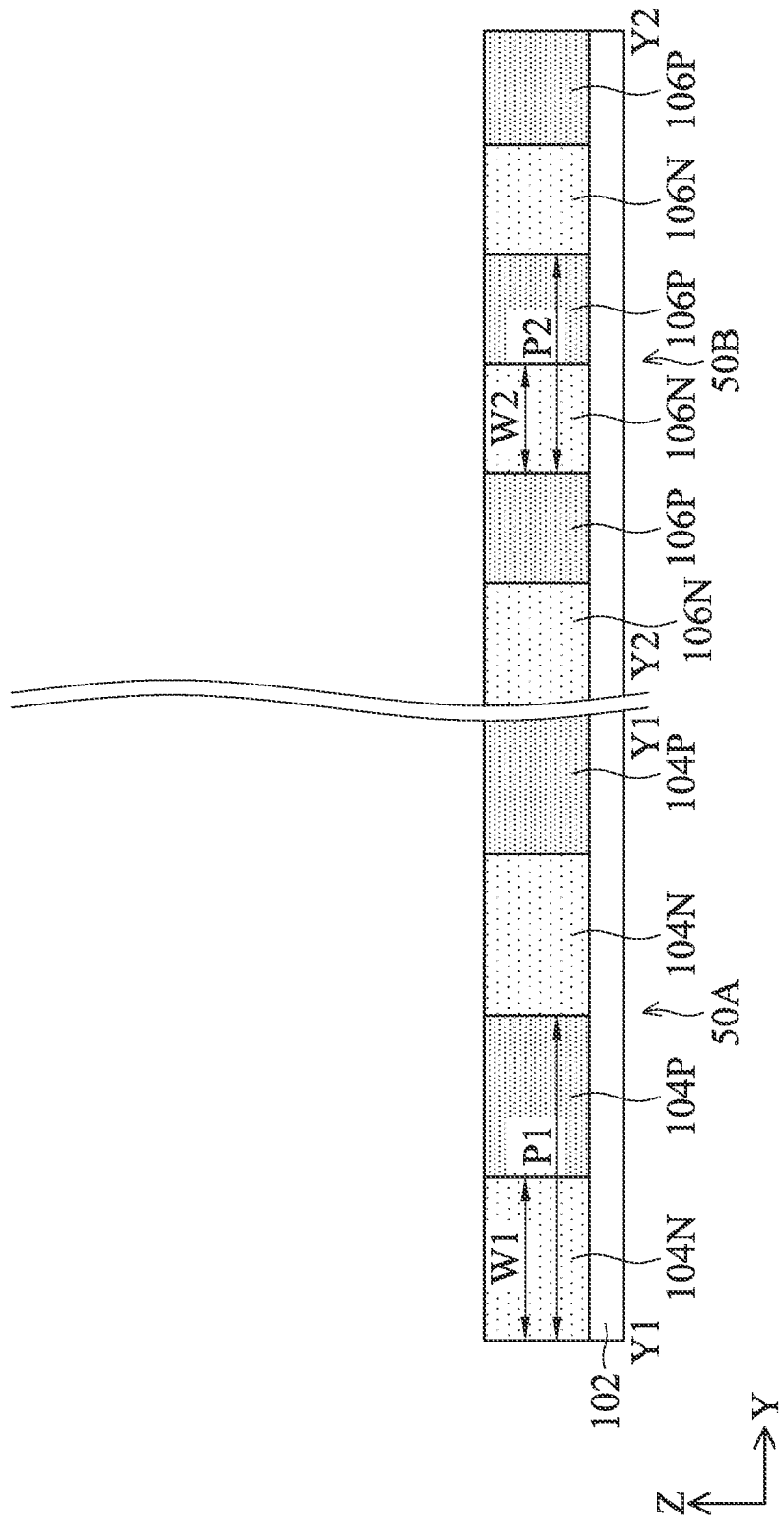
FIGS. 5A-5F are cross-sectional views illustrating the formation of a semiconductor structure at various intermediate stages, in accordance with some embodiments of the disclosure.

In some embodiments, the width W1 (in the Y direction) of the n-type well 104N is greater than the width W2 (in the Y direction) of the n-type well 106N, as shown in FIG. 5A. In sonic embodiments, the width (in the Y direction) of the p-type well 104P is greater than the width (in the Y direction) of the p-type well 106P. In some embodiments, the pitch P1 (in the Y direction) of the n-type well 104N (or the p-type well 104P) is greater than the pitch P2 (in the Y direction) of the n-type well 106N (or the p-type well 106P).

Figure 5B:
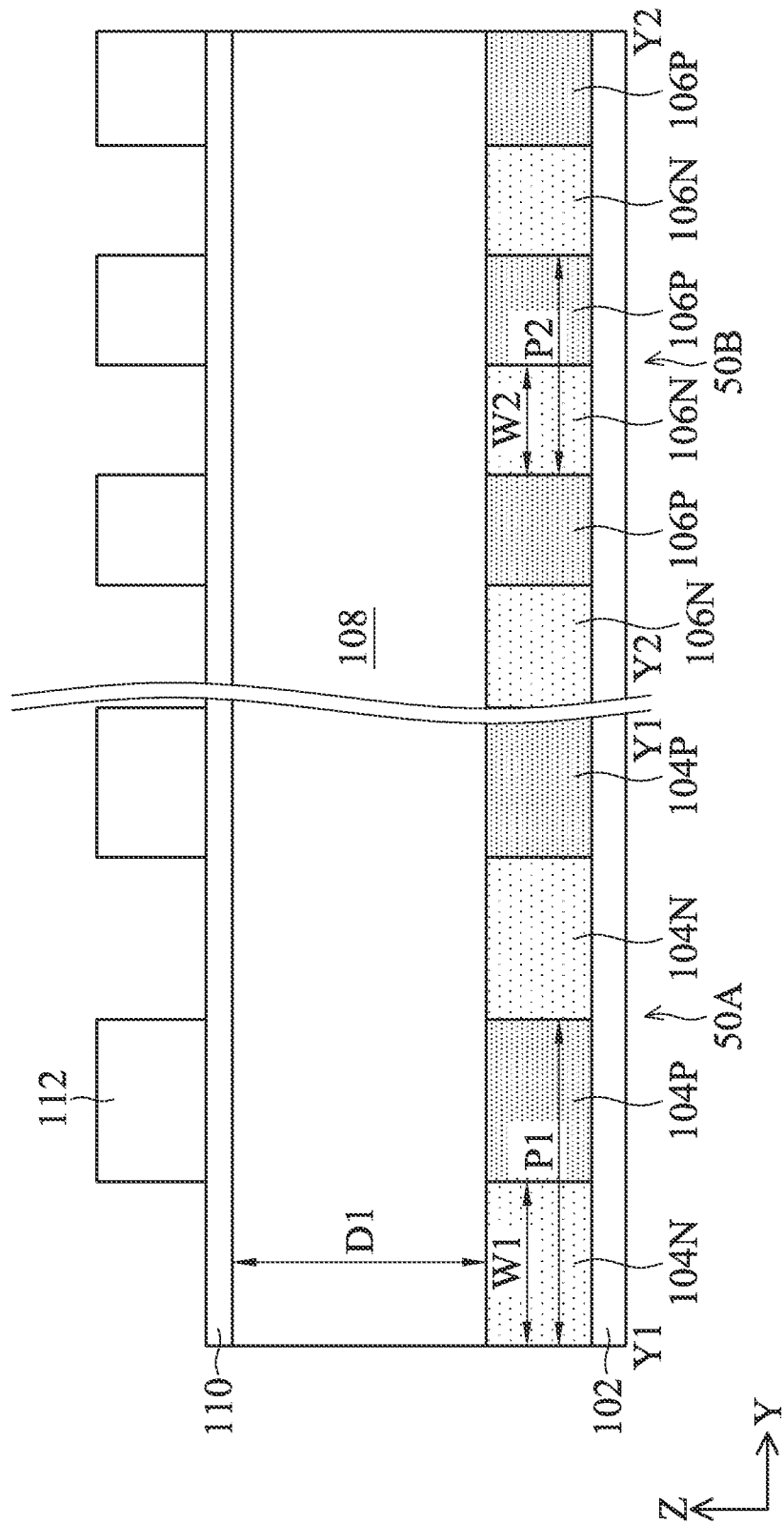

The steps described above with respect to FIG. 2B are performed, thereby forming the semiconductor material 108, the dielectric layer 110 and the patterned mask layer 112, as shown in FIG. 5B, in accordance with some embodiments. The patterned mask layer 112 vertically covers and/or overlaps the p-type wells 104P and 106P, in accordance with some embodiments. In some embodiments, the trench pattern of the patterned mask layer 112 in the memory cell array area 50B has a great density than the trench pattern in the logic area 50A.

Figure 5C:
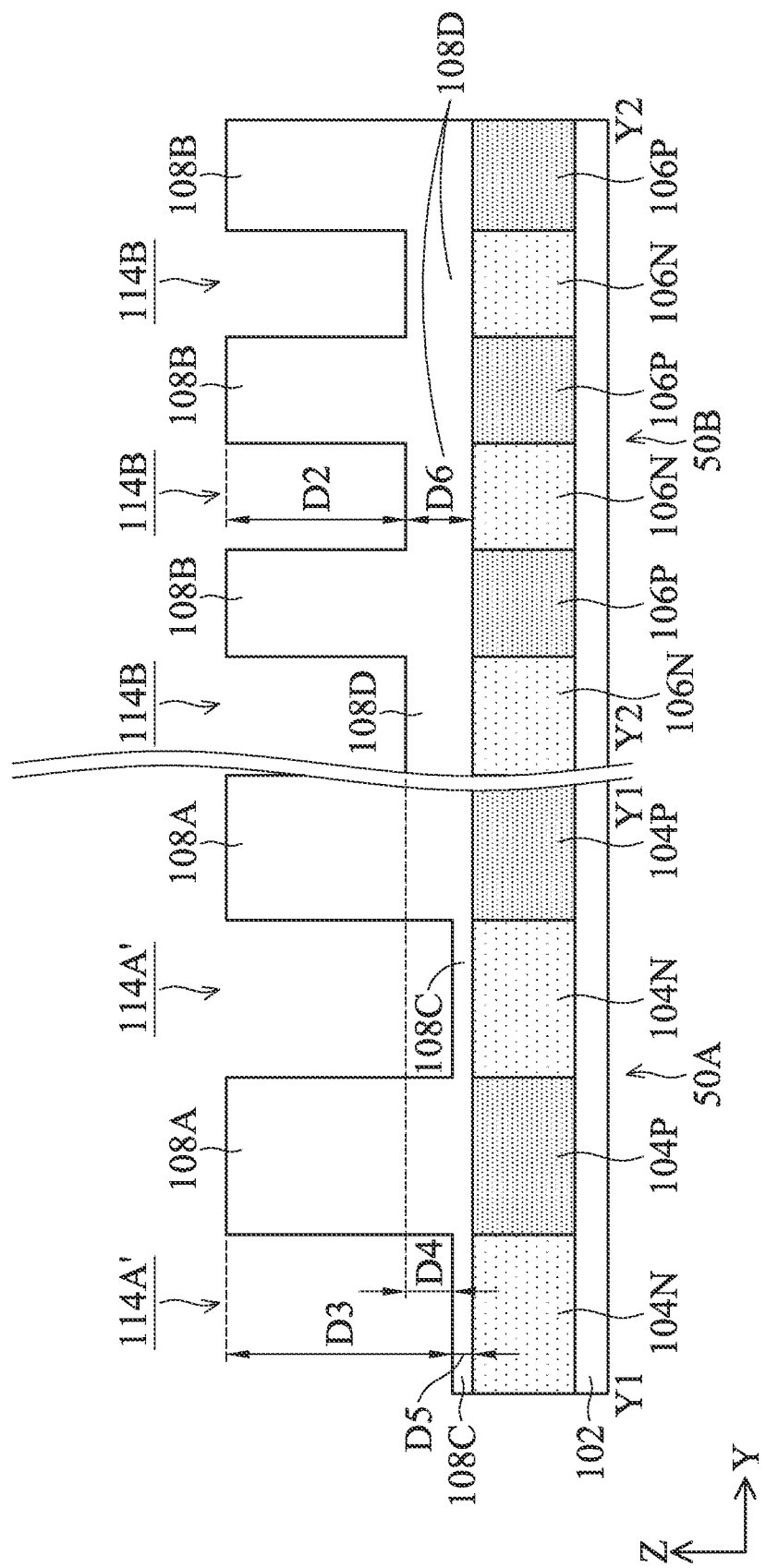
Figure 5D:
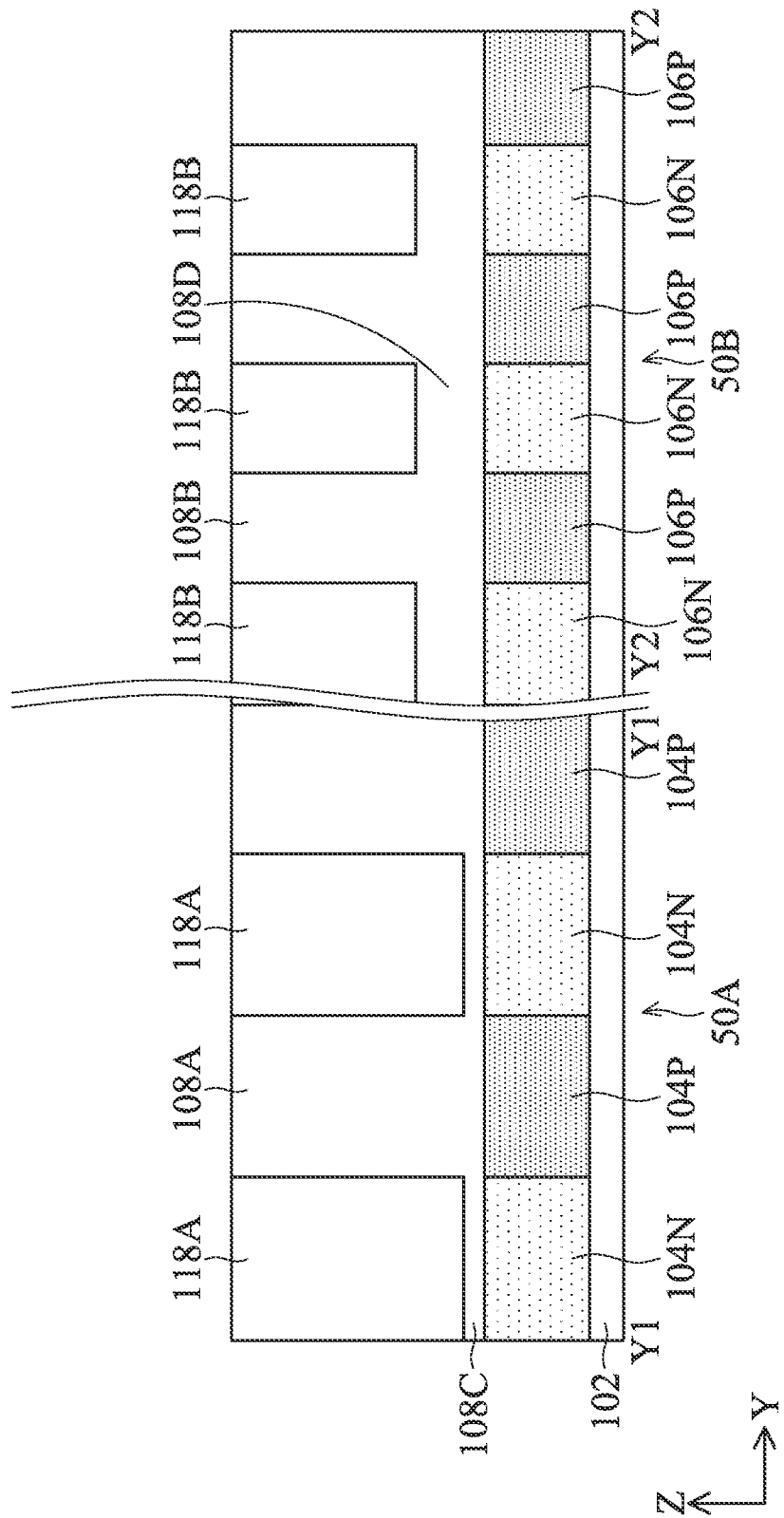

The etching process described above in FIG. 2C is performed to etch away portions of the dielectric layer 110 and the semiconductor material 108 uncovered by the patterned mask layer 112, as shown in FIG. 5C, in accordance with some embodiments. The trench patterns of the patterned mask layer 112 are transferred to the semiconductor material 108, thereby forming trenches 114A' in the logic area 50A and trenches 114B in the memory cell area 50B, in accordance with some embodiments.

Due to the etching loading effect, the etching amount in the logic area 50A which has a relatively low pattern density is greater than the etching amount in the memory cell array area 50B which has a relatively high pattern density, in accordance with some embodiments. As a result, the trench 114A' is deeper than the trench 114B, in accordance with some embodiments.

In some embodiments, the trench 114A' has an etching depth D3 in a range from about 27.5 nm to about 165 nm. In some embodiments, the trench 114A' is deeper than the trench 114B by the dimension D4. In some embodiments, the dimension D4 is in a range from about 2.5 nm to about 15 nm.

In some embodiments, the portion 108C of the semiconductor material 108 directly above the n-type well 104N has a thickness D5. In some embodiments, the thickness D5 is in a range from about 1 nm to about 35 nm. In some embodiments, the portion 108D of the semiconductor material 108 directly above the n-type well 106N is thicker than the portion 108C of the semiconductor material 108 and has a thickness D6. In some embodiments, the thickness D6 is in a range from about 2.5 nm to about 50 nm.

Therefore, by designing different areas of the substrate 102 with different pattern densities to adjust the etching depth, one photolithography process and one etching process for ecessing the portion108C of the semiconductor material 108 may be omitted, in accordance with some embodiments.

The steps described above with respect to FIGs. and 2G are performed, thereby forming the semiconductor material 118 (including 118A and 118B) in the trenches 114' and trenches 114B, as shown in FIG. 6D, in accordance with some embodiments.

Figure 5E:
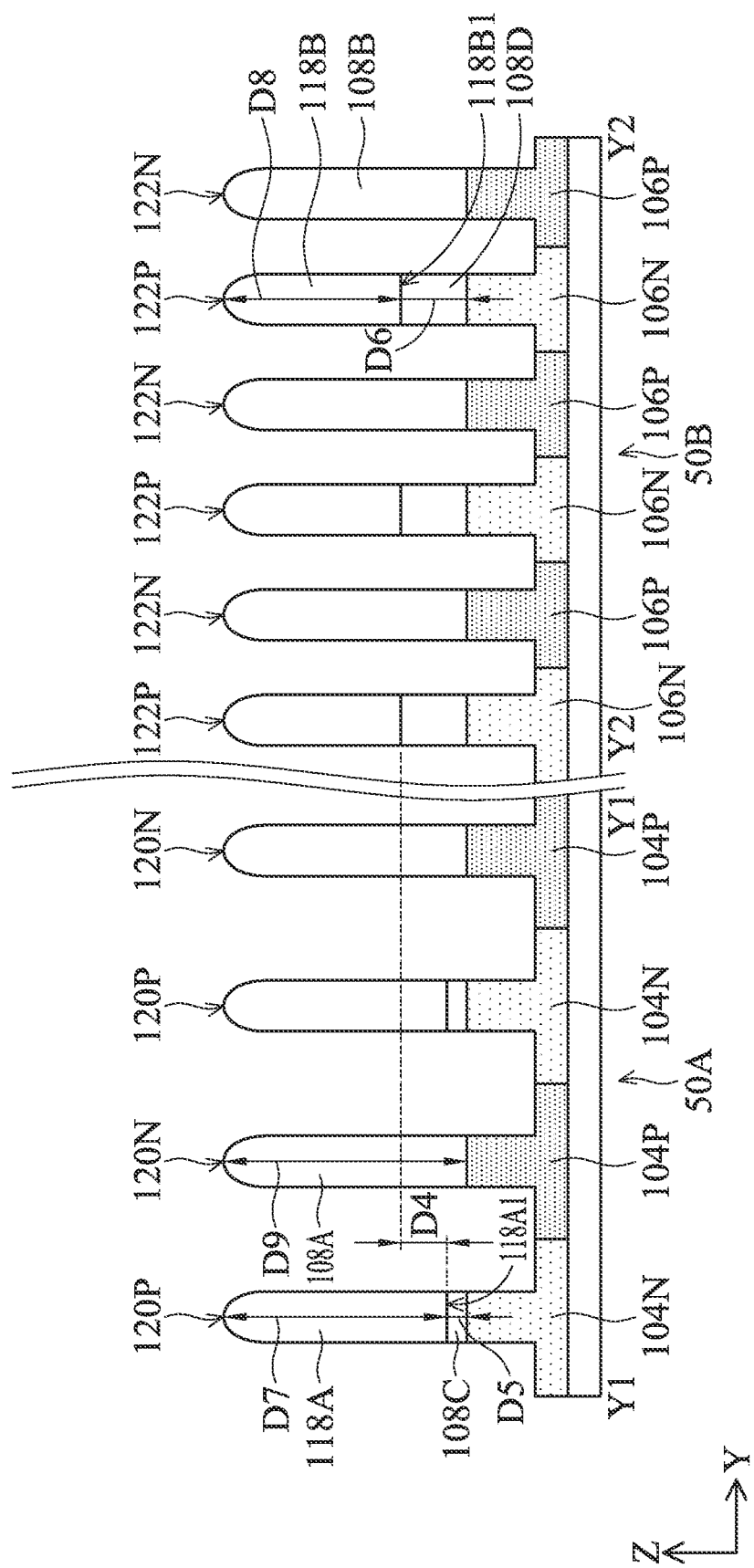

The steps described above with respect to FIGS. 2H-1 and 2H-2 are performed, thereby forming the fin structures 120P, 120N, 122P and 122N, as shown in FIG. 5E, in accordance with some embodiments.

Figure 5F:
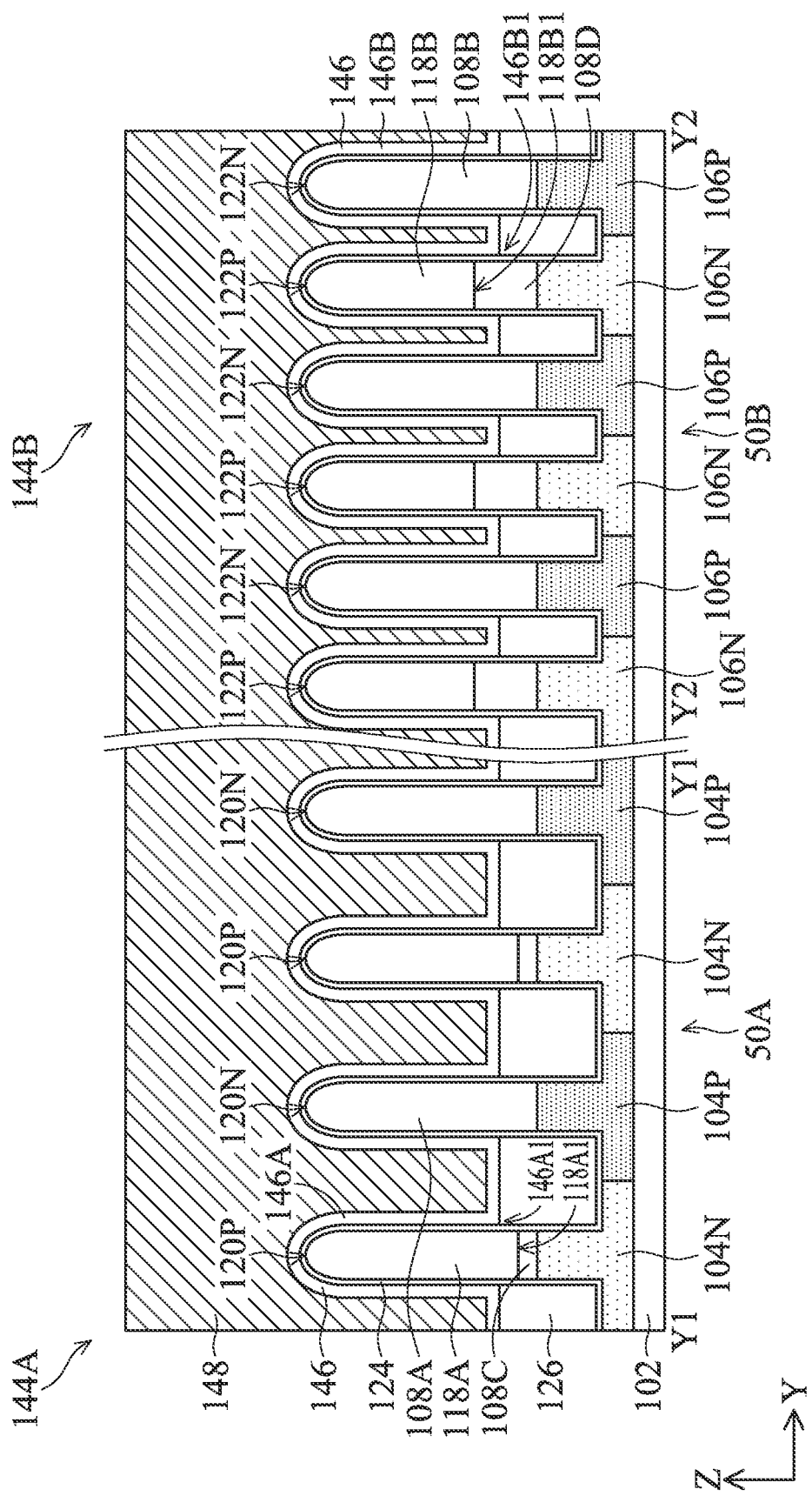

The steps described above with respect to FIGS. 2I-1 through 2L-2 are performed, thereby forming the isolation structure 126, the gate spacer layers 134, the source/drain features 136N and 136P, the contact etching stop layer 138, the interlayer dielectric layer 140, and the final gate stacks 144A and 144B, as shown FIG. 5F, in accordance with some embodiments.

In accordance with embodiments of the present disclosure, the top fin element 118A of the fin structure 120P, which serves as the channel of the p-type FinFET in the logic area 50A, extends downward beyond the final gate stack 144A, thereby providing a relatively large area of the channel. Thus, the performance of the resulting logic device may be enhanced.

In addition, in accordance with embodiments of the present disclosure, because the top fin element 118B of the fin structure 122P, which serves as the channel of the p-type FinFET (e.g., pull-up transistor for an SRAM cell) in the memory cell array area 50B, is encapsulated in the final gate stack 144B, the final gate stack 144B can have better control over the channel, especially for the bottom portion of the top fin element 118B. Thus, the performance of the resulting SRAM device may be enhanced.

As described above, the aspect of the present disclosure is directed to forming p-channel devices in a logic area and a memory cell array area having respective enhancing performances. In some embodiments, logic devices may focus more on high on-current, while memory devices (e.g., SRAM) may focus more on improvement in SCE. The top fin element 118A of the fin structure 120P for logic devices is formed with a greater thickness than the top fin element 118B of the fin structure 122P for memory devices, in accordance with some embodiments. Therefore, the top fin element 118A may provide a relatively large area of the channel, which enhance the performance of the resulting logic device. Furthermore, the final gate stack 144B can have better control over the top fin element 118B, which may enhance the performance of the resulting SRAM device.

Embodiments of a method for forming a semiconductor structure are provided. The method for forming the semiconductor structure may include recessing a first semiconductor material to form a first trench in a logic area and a second trench in a memory cell array area, forming a second semiconductor material in the first trench and the second trench, and patterning the second semiconductor material in the first trench to form first fin structure in the logic area and patterning the second semiconductor material in the second trench to form second fin structure in the memory cell array area. The first trench may be deeper than the second trench, and thus the second semiconductor material of the first fin structure is thicker than the second semiconductor material of the second fin structure. Therefore, the logic device formed on the first fin structure may have an enhanced performance (e.g., greater on-current), while the memory device formed on the second fin structure may have an enhanced performance (e.g., improvement in SCE).

In some embodiments, a method for forming a semiconductor structure is provided. The method for forming the semiconductor structure includes forming a first semiconductor material over a substrate, and forming a first trench and a second trench in the first semiconductor material. The first trench is deeper than the second trench. The method also includes forming a second semiconductor material in the first trench and the second trench, patterning a first portion of the second semiconductor material in the first trench and a first portion of the first semiconductor material below the first portion of the second semiconductor material into a first fin structure, and patterning a second portion of the second semiconductor material in the second trench and a second portion of the first semiconductor material below the second portion of the second semiconductor material into a second fin structure. The method also includes forming an isolation structure over the substrate to surround the first fin structure and the second fin structure.

In some embodiments, a method for forming a semiconductor structure is provided. The method for forming the semiconductor structure includes forming a first n-type well, a p-type well, and a second n-type well in a substrate, and forming a first semiconductor material over the substrate. A first portion of the first semiconductor material directly above the first n-type well is thinner than a second portion of the first semiconductor material directly above the second n-type well. The second portion of the first semiconductor material is thinner than a third portion of the first semiconductor material directly above the p-type well. The method also includes forming a second semiconductor material over the first portion and the second portion of the first semiconductor material, etching the second semiconductor material and the first semiconductor material to form a first fin structure over the first n-type well, a second fin structure over the p-type well, and a third fin structure over the second n-type well, and forming a dummy gate structure across the first fin structure, the second fin structure, and the third fin structure.

In some embodiments, a semiconductor structure is provided. The semiconductor structure includes a first fin structure over a substrate, and the first fin structure includes a first middle fin element and a first top fin element over the first middle fin element and with a different composition than the first middle fin element. The semiconductor structure also includes a first gate dielectric layer surrounding the first fin structure. The semiconductor structure also includes a second fin structure over the substrate, and the second fin structure includes a second middle fin element and a second top fin element over the second middle fin element and with a different composition than the second middle fin element. The first top fin element is thicker than the second top fin element. The semiconductor structure also includes a second dielectric layer surrounding the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various chanes, substitutions, and alterations herein without departing from the spirit and scope of the present disclosure.

What is claimed is:

1. A method for forming a semiconductor structure, comprising:
   forming a first semiconductor material over a substrate;
   forming a first trench and a second trench in the first semiconductor material, wherein the first trench is deeper than the second trench;
   forming a second semiconductor material in the first trench and the second trench;
   patterning a first portion of the second semiconductor material in the first trench and a first portion of the first semiconductor material below the first portion of the second semiconductor material into a first fin structure;
   patterning a second portion of the second semiconductor material in the second trench and a second portion of the first semiconductor material below the second portion of the second semiconductor material into a second fin structure; and
   forming an isolation structure over the substrate to surround the first fin structure and the second fin structure.

2. The method for forming the semiconductor structure as claimed in claim 1, wherein the first semiconductor material is silicon, and the second semiconductor material is silicon germanium.

3. The method for forming the semiconductor structure as claimed in claim 1, wherein a top surface of the isolation structure is located at a position that is higher than a bottom surface of the second semiconductor material of the first fin structure and lower than a bottom surface of the second semiconductor material of the second fin structure.

4. The method for forming the semiconductor structure as claimed in claim 1, wherein forming the first trench and the second trench in the first semiconductor material comprises:
   etching the first semiconductor material to form the first trench and the second trench;
   forming a patterned mask layer covering the second trench;
   etching the first semiconductor material using the patterned mask layer to enlarge the first trench.

5. The method for forming the semiconductor structure as claimed in claim 1, further comprising:
   forming a semiconductor capping layer along the first fin structure and the second fin structure before forming the isolation structure.

6. The method for forming the semiconductor structure as claimed in claim 1, wherein the first fin structure is formed in a logic area of the substrate, and the second fin structure is formed in a memory cell array area of the substrate.

7. The method for forming the semiconductor structure as claimed in claim 1, further comprising:
   implanting the substrate with an n-type dopant to form a first n-type well and a second n-type well; and
   implanting the substrate with a p-type dopant to form a p-type well, wherein the first n-type well and the second n-type well are spaced apart from one another by the p-type well, and the first trench is located directly above the first n-type well and the second trench is located directly above the second n-type well.

8. The method for forming the semiconductor structure as claimed in claim 7, further comprising:
   patterning a third portion of the first semiconductor material directly above the p-type well into a third fin structure.

9. The method for forming the semiconductor structure as claimed in claim 1, further comprising:
   forming a gate dielectric layer over the first fin structure, the second fin structure and the isolation structure, wherein:
   the gate dielectric layer includes a first portion extending along a sidewall of the first fin structure, and a bottom of the first portion of the gate dielectric layer is higher than a bottom surface of the second semiconductor material of the first fin structure,
   the gate dielectric layer further includes a second portion extending along a sidewall of the second fin structure, and a bottom of the second portion of the gate dielectric layer is lower than a bottom surface of the second semiconductor material of the second fin structure; and
   forming a gate electrode layer over the gate dielectric layer.

10. A method for forming a semiconductor structure, comprising:
    forming a first n-type well, a p-type well, and a second n-type well in a substrate;
    forming a first semiconductor material over the substrate, wherein a first portion of the first semiconductor material directly above the first n-type well is thinner than a second portion of the first semiconductor material directly above the second n-type well, and the second portion of the first semiconductor material is thinner than a third portion of the first semiconductor material directly above the p-type well;

forming a second semiconductor material over the first portion and the second portion of the first semiconductor material;

etching the second semiconductor material and the first semiconductor material to form a first fin structure over the first n-type well, a second fin structure over the p-type well, and a third fin structure over the second n-type well; and forming a dummy gate structure across the first fin structure, the second fin structure, and the third fin structure.

11. The method for forming the semiconductor structure as claimed in claim 10, wherein the second semiconductor material of the first fin structure is thicker than the second semiconductor material of the third fin structure.

12. The method for forming the semiconductor structure as claimed in claim 10, further comprising:

forming an insulating layer over the first fin structure, the second fin structure, and the third fin structure, and recessing the insulating layer to form an isolation structure surrounding the first fin structure, the second fin structure and the third fin structure, wherein the isolation structure has a curved top surface.

13. The method for forming the semiconductor structure as claimed in claim 12, wherein:

the isolation structure has a first side surface facing the first fin structure, and a first top of the first side surface is located at a higher position than a bottom surface of the second semiconductor material of the first fin structure, and the isolation structure has a second side surface facing the side fin structure, and a second top of the second side surface is located at a lower position than a bottom surface of the second semiconductor material of the third fin structure.

14. The method for forming the semiconductor structure as claimed in claim 13, wherein the curved top surface of the isolation structure has a lowest point, and the lowest point is lower than the bottom surface of the second semiconductor material of the first fin structure.

15. The method for forming the semiconductor structure as claimed in claim 10, wherein a width of the first n-type well is greater than a width the second n-type well.

16. A semiconductor structure, comprising:

a first fin structure over a substrate, wherein the first fin structure includes a first middle fin element and a first top fin element over the first middle fin element and with a different composition than the first middle fin element;

a first gate dielectric layer surrounding the first fin structure;

a second fin structure over the substrate, wherein the second fin structure includes a second middle fin element and a second top fin element over the second middle fin clement and with a different composition than the second middle fin clement, wherein the first top fin element is thicker than the second top fin element; and a second gate dielectric layer surrounding the second fin structure.

17. The semiconductor structure as claimed in claim 16, wherein the first middle fin element is thinner than the second middle fin element.

18. The semiconductor structure as claimed in claim 16, wherein the first middle fin element and the second fin element are made of silicon, and the first top fin element and the second top are made of silicon germanium.

19. The semiconductor structure as claimed in claim 16, wherein:

the first gate dielectric layer includes a first portion extending along a sidewall of the first fin structure, and a bottom of the first portion of the first gate dielectric layer is higher than a bottom surface of the second semiconductor material of the first fin structure, and the second gate dielectric layer further includes a second portion extending along a sidewall of the second fin structure, and a bottom of the second portion of the second gate dielectric layer is lower than a bottom surface of the second semiconductor material of the second fin structure.

20. The semiconductor structure as claimed in claim 16, further comprising:

a logic transistor comprising the first fin structure, the first gate dielectric layer, and a first gate electrode layer over the first gate dielectric layer; and a pull-up transistor of an SRAM cell comprising the second fin structure, the second gate dielectric layer, and a second gate electrode layer over the second gate dielectric layer.

* * * * *